United States Patent
Katabarwa

(10) Patent No.: US 11,288,121 B2
(45) Date of Patent: Mar. 29, 2022

(54) SIMULATING ERRORS OF A QUANTUM DEVICE USING VARIATIONAL QUANTUM CHANNELS

(71) Applicant: Zapata Computing, Inc., Boston, MA (US)

(72) Inventor: Amara Katabarwa, Cambridge, MA (US)

(73) Assignee: Zapata Computing, Inc., Boston, MA (US)

( * ) Notice: Subject to any disclaimer, the term of this patent is extended or adjusted under 35 U.S.C. 154(b) by 134 days.

(21) Appl. No.: 16/851,833

(22) Filed: Apr. 17, 2020

(65) Prior Publication Data
US 2020/0334107 A1  Oct. 22, 2020

Related U.S. Application Data

(60) Provisional application No. 62/836,451, filed on Apr. 19, 2019.

(51) Int. Cl.
*G06N 10/00* (2019.01)
*G06F 11/10* (2006.01)

(52) U.S. Cl.
CPC ......... *G06F 11/1076* (2013.01); *G06N 10/00* (2019.01)

(58) Field of Classification Search
None
See application file for complete search history.

(56) References Cited

U.S. PATENT DOCUMENTS

| | | | |
|---|---|---|---|
| 7,353,148 B1* | 4/2008 | Meyers | G06N 10/00 703/2 |
| 2007/0239366 A1* | 10/2007 | Hilton | G06N 10/00 702/27 |
| 2017/0357539 A1* | 12/2017 | Dadashikelayeh | G06F 16/25 |
| 2018/0246851 A1 | 8/2018 | Zaribafiyan et al. | |
| 2018/0260245 A1* | 9/2018 | Smith | G06F 9/542 |
| 2019/0080255 A1* | 3/2019 | Allen | G06N 20/00 |

(Continued)

FOREIGN PATENT DOCUMENTS

| | | |
|---|---|---|
| KR | 20160132943 A | 11/2016 |
| WO | 2019055843 A1 | 3/2019 |
| WO | 2020214910 A1 | 10/2020 |

OTHER PUBLICATIONS

Nyman, P. (2008). Simulation of Quantum Error Correcting Code. arXiv: Quantum Physics. (Year: 2008).*

(Continued)

*Primary Examiner* — Daniel F. McMahon
(74) *Attorney, Agent, or Firm* — Blueshift IP, LLC; Robert Plotkin

(57) ABSTRACT

A hybrid quantum classical (HQC) computer system, which includes both a classical computer component and a quantum computer component, implements indirect benchmarking of a near term quantum device by directly benchmarking a virtual quantum machine that models the quantum computer device and that has a level of errors that corresponds to the level of errors associated with the quantum computer device. The direct benchmarking, conducted using quantum error correction tools, produces a probability distribution of error syndromes that may be used as a probability distribution of error syndromes for the quantum computer device.

20 Claims, 10 Drawing Sheets

(56) References Cited

U.S. PATENT DOCUMENTS

2019/0266508 A1* 8/2019 Bunyk ............... G06F 11/0751
2020/0274554 A1* 8/2020 Aspuru-Guzik ....... G06N 10/00

OTHER PUBLICATIONS

Bishop, L., et al., "Quantum Volume", Technical report, IBM T.J. Watson, pp. 1-5 (Mar. 4, 2017).
Dumitrescu, E., et al., "Tensor Network Benchmarking for Quantum Computing", Beyond CMOS Computing Workshop: The Interconnect Challenge, Session 1, Talk 4, pp. 1-25 (2017).
Heya, K., et al., "Variational Quantum Gate Optimization", Quantum Physics, arXiv:1810.12745v1, pp. 1-10 (Oct. 30, 2018).
Michielsen, K., et al., "Benchmarking gate-based quantum computers", Quantum Physics, arXiv:1706.04341, vol. 220 pp. 1-33 (Jun. 14, 2017).
Nelder, J. A., and Mead, R., "A simplex method for function minimization", The Computer Journal, vol. 7, Issue. 4, pp. 308-313 (Jan. 1965).
Powell, M. J. D., "A Direct Search Optimization Method That Models the Objective and Constraint Functions by Linear Interpolation", In: Gomez S., Hennart JP. (eds) Advances in Optimization and Numerical Analysis. Mathematics and its Applications, vol. 275. Springer, Dordrecht, pp. 1-2 (1994).
Steane, A., "Multiple Particle Interference and Quantum Error Correction", Proceedings of the Royal Society A, The royal Society, vol. 452, Issue. 1954, pp. 2551-2577 (Nov. 8, 1996).
Wootton, J. R., "Benchmarking of quantum processors with random circuits", arXiv: Quantum Physics, arXiv:1806.02736v1, pp. 1-15 (Jun. 7, 2018).
Zhukov, A. A., et al., "Quantum communication protocols as a benchmark for quantum computers", arXiv:1812.00587v1, pp. 1-25 (Dec. 3, 2018).
International Search Report & Written Opinion dated Jul. 27, 2020, in international patent application No. PCT/US2020/028670, 7 pages.
Schuld, M., et al., "Circuit-centric quantum classifiers", arXiv:1804.00633v1, Apr. 2, 2018, pp. 1-17.
Seeley, J.T., et al., "The Bravyi-Kitaev transformation for quantum computation of electronic structure," The Journal of chemical physics, 137(22):224109, 2012. arXiv:1208.5986, pp. 1-38 (Aug. 29, 2012).
Sepiol, M.A., "A High-Fidelity Microwave Driven Two-Qubit Quantum Logic Gate in 43Ca+", pp. 1-197 (2016).
Sergeevich, A., et al., "Characterization of a Qubit Hamiltonian Using Adaptive Measurements in a Fixed Basis", arXiv:1102.3700v2, Nov. 23, 2011, pp. 1-6.
Sevag Gharibian et al., "Oracle Complexity Classes and Local Measurements on Physical Hamiltonians," In 37th Interational Symposium on Theoretical Aspects of Computer Science (STACS 2020). Schloss Dagstuhl-Leibniz-Zentrum für Informatik, 2020. arXiv:1909.05981, Sep. 12, 2019, 38 pages.
Sevag Gharibian et al., "The complexity of simulating local measurements on quantum systems," Quantum, 3:189, 2019. arXiv:1606.05626, Apr. 7, 2020, 38 pages.
Shantanav Chakraborty et al., "The Power of Blockencoded Matrix Powers: Improved Regression Techniques Via Faster Hamiltonian Simulation," arXiv preprint arXiv:1804.01973, Sep. 3, 2018, 58 pages.
Skolik, A., et al., "Layerwise learning for quantum neural networks," arXiv:2006.14904, vol. 3, No. 5 pp. 1-11 (Jun. 26, 2020).
Sunkin Sim et al., "Expressibility and Entangling Capability of Parameterized Quantum Circuits for Hybrid Quantum-Classical Algorithms", arXiv:1905.10876v1, May 25, 2019, 18 pages. Available online at <URL: https://arxiv.org/abs/1905.10876v1.pdf>.
Swarnadeep Majumder et al., "Real-time calibration with spectator qubits", npj Quantum Information, vol. 6, Retrieved from: <URL: https://www.nature.com/articles/s41534-020-0251-y>, Feb. 7, 2020, 9 pages.
Szabo, A. and Ostlund, N.S., "Modern quantum chemistry: introduction to advanced electronic structure theory," Courier Corporation, 2012. pp. 1-479 (2012).
T. Albash et al., "Adiabatic quantum computation," Rev. Mod. Phys. 90, 015002 (2018) 71 pages.
T. Hospedales et al., "Meta-Learning in Neural Networks: A Survey," arXiv e-prints , arXiv:2004.05439, Nov. 7, 2020, 20 pages.
Temme, K., et al., "Error Mitigation for Short-Depth Quantum Circuits", Physical review letters, vol. 119, No. 18, 180509, pp. 1-15 (2017).
Thomas E O'Brien et al., "Calculating energy derivatives for quantum chemistry on a quantum computer," NPJ Quantum Information, 5(1):1-12, 2019.
Torlai, G., et al., "Neural-Network Quantum State Tomography", Nature Physics, vol. 14, No. 5, Feb. 2018, pp. 1-6.
Tyler Takeshita et al., "Increasing the Representation Accuracy of Quantum Simulations of Chemistry without Extra Quantum Resources," Phys. Rev. X 10 (Jan. 1, 2020), p. 011004. doi: 10.1103/PhysRevX.10.011004. url: https://link.aps.org/doi/10.1103/PhysRevX.10.011004.
Tzu-Ching Yen, et al., "Measuring all Compatible Operators in One Series of Single-Qubit Measurements Using Unitary Transformations," Journal of Chemical Theory and Computation, 16(4):2400-2409, 2020. arXiv:1907.09386.
Urbanek, M., et al., "Chemistry on Quantum Computers with Virtual Quantum Subspace Expansion," Journal of Chemical Theory and Computation 16.9, pp. 5425-5431. doi: 10.1021/acs.jctc.0c00447. (Feb. 28, 2020).
V. Bergholm et al., "Pennylane: Automatic differentiation of hybrid quantum-classical computations," arXiv preprint arXiv:1811.04968, Feb. 14, 2020, 15 pages.
Verdon, G., et al., "Learning to learn with quantum neural networks via classical neural networks," arXiv:1907.05415, pp. 1-12 (Jul. 11, 2019).
Verstraete, F., et al., "Quantum Circuits for Strongly Correlated Quantum Systems", arXiv:0804.1888v1, Apr. 11, 2008, pp. 1-5.
Verteletskyi, V., et al., "Measurement optimization in the variational quantum eigensolver using a minimum clique cover", Quantum Physics, arXiv:1907.03358v4, pp. 1-7 (Mar. 26, 2019).
Wang, D., et al., "Accelerated Variational Quantum Eigensolver", arXiv:1802.00171v3, Mar. 25, 2019, pp. 1-11.
Wang, G., et al., "Bayesian Inference with Engineered Likelihood Functions for Robust Amplitude Estimation", arXiv:2006.09350v2, Jun. 26, 2020, pp. 1-62.
Wang, G., et al., "Minimizing Estimation Runtime on Noisy Quantum Computers," PRX Quantum 2.1 pp. 010346-1-49 (2021).
Watson, J.D., et al., "The complexity of translationally invariant problems beyond ground state energies", arXiv preprint arXiv:2012.12717, pp. 1-58 (Dec. 23, 2020).
Wecker, D., et al., "Solving strongly correlated electron models on a quantum computer", Physical Review A, vol. 92, No. 6, pp. 1-27 (2015).
Wecker, D., et al., "Progress towards practical quantum variational algorithms", Phys. Rev. A 92, 042303, pp. 1-11 (2015).
Wecker, D., et al., "Towards Practical Quantum Variational Algorithms", Physical Review A, vol. 92, No. 4, 042303, pp. 1-11 (2015).
Wiebe, N., and Granade, C., "Efficient Bayesian Phase Estimation", arXiv:1508.00869v1, Aug. 4, 2015, pp. 1-12.
Wiebe, N., et al., "Higher Order Decompositions of Ordered Operator Exponentials", Mathematical Physics, arXiv:0812.0562v3, pp. 1-16 (Dec. 4, 2008).
William M Kirby et al., "Classical simulation of noncontextual Pauli Hamiltonians," Physical Review A 102.3 (2020), p. 032418. arXiv:2002.05693.
William M Kirby et al., "Contextual Subspace Variational Quantum Eigensolver," Quantum 5 (2021), p. 456. https://quantum-journal.org/papers/q-2021-05-14-456/pdf/ arXiv:2011.10027.
William M Kirby et al., "Contextuality Test of the Nonclassicality of Variational Quantum Eigensolvers," Physical review letters 123.20 (2019), p. 200501. arXiv:1904.02260.

(56) References Cited

OTHER PUBLICATIONS

Willsch, M., et al., "Benchmarking the quantum approximate optimization algorithm," Quantum Information Processing 19, 197, pp. 1-24 (2020).
Wilson, M., et al., "Optimizing quantum heuristics with meta-learning," arXiv:1908.03185, pp. 1-13 (Aug. 8, 2019).
Yigal Meir et al., "Landauer formula for the current through an interacting electron region," Physical review letters, 68(16):2512, 1992, 5 pages.
Yigit Subasi et al., "Quantum algorithms for systems of linear equations inspired by adiabatic quantum computing," Physical review letters, 122(6):060504, 2019. arXiv:1805.10549, May 26, 2018, 9 pages.
Yimin Ge et al., "Faster Ground State Preparation and High-Precision Ground Energy Estimation with Fewer Qubits," Journal of Mathematical Physics, 60(2):022202, 2019. arXiv:1712.03193, Feb. 2, 2018, 25 pages.
Yosi Atia et al., "Fast-Forwarding of Hamiltonians and Exponentially Precise Measurements," Nature communications, 8(1) pp. 1-9, Nov. 17, 2017.
Yudong Cao et al., "Potential of Quantum Computing for Drug Discovery," IBM Journal of Research and Development, vol. 62, Issue 6, pp. 6:1-6:20, Nov./Dec. 2018.
Zhao, A., et al., "Measurement reduction in variational quantum algorithms", Quantum Physics, arXiv:1908.08067v2, pp. 1-21 (Dec. 16, 2019).
Zhenguo Li et al., "Meta-sgd: Learning to learn quickly for few-shot learning," arXiv preprint arXiv:1707.09835, Sep. 28, 2017, 11 pages.
Zhou, L., et al., "Quantum approximate optimization algorithm: Performance, mechanism, and implementation on near-term devices," Phys. Rev. X 10, 021067 pp. 1-23 (2020).
Gilyén, A., et al., "Quantum Singular Value Transformation and Beyond: Exponential Improvements for Quantum Matrix Arithmetics," In Proceedings of the 51st Annual ACM SIGACT Symposium on Theory of Computing, pp. 193-204, 2019. arXiv:1806.01838, Jun. 5, 2018, 67 pages.
Goemans, M.X., et al., "Improved Approximation Algorithms for Maximum Cut and Satisfiability Problems Using Semidefinite Programming", Journal of the ACM (JACM), vol. 42, No. 6, pp. 1115-1145 (Nov. 1995).
Gokhale, P., and Chong, F.T., "O(N3) Measurement Cost for Variational Quantum Eigensolver on Molecular Hamiltonians", arXiv:1908.11857v1, pp. 1-5 (Aug. 30, 2019).
Gokhale, P., et al., "Minimizing state preparations in variational quantum eigensolver by partitioning into commuting families", Quantum Physics, arXiv:1907.13623v1, pp. 1-23 (Jul. 31, 2019).
Gonthier, J., et al., "Identifying challenges towards practical quantum advantage through resource estimation: the measurement roadblock in the variational quantum eigensolver," Quantum Physics, arXiv:2012.04001, pp. 1-27 (Dec. 7, 2020).
Grant, E., et al., "An initialization strategy for addressing barren plateaus in parametrized quantum circuits," Quantum 3, 214, pp. 1-9 (Nov. 28, 2019).
Grimsley, H.R., et al., "An adaptive variational algorithm for exact molecular simulations on a quantum computer," Nature Communications 10, 3007, pp. 1-9 (2019).
Grover, L.K., "A fast quantum mechanical algorithm for database search," arXiv preprint quant-ph/9605043, pp. 1-8 (May 1996).
Grover, L.K., "A fast quantum mechanical algorithm for database search", STOC '96: Proceedings of the twenty-eighth annual ACM symposium on Theory of Computing, pp. 1-8 (Jul. 1996).
Handy, N.C., et al., "Size-consistent Brueckner theory limited to double substitutions", Chemical Physics Letters, vol. 164, No. 2-3, pp. 185-192 (Dec. 8, 1989).
Harrow, A. W., et al., "Quantum algorithm for linear systems of equations", Phys. Rev. Lett., vol. 103, No. 15, 1-15 (2009).
Helgaker T. et al., "Molecular Electronic-Structure Theory", Book published by John Wiley & Sons, pp. 1-908 (2000).

Hoyer, P., et al., "On Arbitrary Phases in Quantum Amplitude Amplification", arXiv:quant-ph/0006031v1, pp. 1-6 (Jun. 7, 2000).
Huang, H., et al., "Near-term quantum algorithms for linear systems of equations," arXiv preprint arXiv:1909.07344, pp. 1-22 (Dec. 16, 2019).
Huggins, W. J., et al., "Efficient and noise resilient measurements for quantum chemistry on near-term quantum computers", Quantum Physics, arXiv:1907.13117v3, pp. 1-10 (Sep. 23, 2019).
International Search Report & Written Opinion dated Dec. 11, 2020, in international patent application No. PCT/US2020/049605, 14 pages.
International Search Report & Written Opinion dated Feb. 18, 2021, in international patent application No. PCT/US2020/058119, 7 pages.
International Search Report & Written Opinion dated Jan. 5, 2021, in international patent application No. PCT/US2020/052958, 7 pages.
International Search Report & Written Opinion dated May 11, 2020, in International Patent Application No. PCT/US2020/013181, 11 pages.
International Search Report & Written Opinion dated Nov. 6, 2020, in international patent application No. PCT/US2020/044615, 8 pages.
International Search Report & Written Opinion dated Sep. 6, 2021, in international patent application PCT/US2021/033089, 8 pages.
International Search Report and Written Opinion dated Dec. 6, 2019 in PCT International Patent Application No. PCT/US2019/046895, 9 pages.
International Search Report and Written Opinion dated Mar. 15, 2021, in International Patent Application No. PCT/US2020/061631, 7 pages.
International Search Report and Written Opinion dated Sep. 21, 2020, in international patent application No. PCT/US2020/037655, pp. 1-8.
Izmaylov, A. F., et al., "Unitary Partitioning Approach to the Measurement Problem in the Variational Quantum Eigensolver Method", Quantum Physics, arXiv:1907.09040v2, pp. 1-7 (Oct. 18, 2019).
Johnson, P. D., et al., "QVECTOR: an algorithm for device-tailored quantum error correction", arXiv preprint arXiv:1711.02249v1, pp. 1-16 (Nov. 7, 2017).
Johnson, P.D., et al., "A Method for Improving Quantum Optimization Algorithms: The Marginals Optimization Procedure", ICE 5th Conference on Quantum Information, Spain, (May 28-31 2019), Book of Abstracts p. 59.
Jones T., and Benjamin S. C., et al., "Quantum compilation and circuit optimisation via energy dissipation", arXiv:1811.03147, pp. 1-13 (Dec. 19, 2018).
Jordan, P., et al., "In the Collected Works of Eugene Paul Wigner: Part A: The Scientific Papers—Chapter: Über das Paulische Äquivalenzverbot", pp. 109-129. Springer (1993).
Kandala, A., et al., "Hardware-efficient variational quantum eigensolver for small molecules and quantum magnets", Nature 549, pp. 242-246 (Oct. 13, 2017).
Kandala, A., et al., "Hardware-efficient Variational Quantum Eigensolver for Small Molecules and Quantum Magnets", Nature, vol. 549, pp. 1-24 (2017).
Kaushal, V., et al., "Shuttling-based trapped-ion quantum information processing", AVS Quantum Science, vol. 2, No. 1, pp. 1-25 (2020).
Kingma, D.P., and BA, J.L., "Adam: A method for stochastic optimization," arXiv preprint arXiv:1412.6980, pp. 1-15 (2014).
Kitaev, A.Y., "Quantum Measurements and the Abelian Stabilizer Problem", arXiv preprint quant-ph/9511026, pp. 1-22 (Nov. 20, 1995).
Kivlichan, I. D., et al., "Quantum Simulation of Electronic Structure with Linear Depth and Connectivity", Phys. Rev. Lett. 120, arXiv:1711.04789v2, pp. 1-6 (Mar. 13, 2018).
Kjaergaard, M., et al., "Superconducting Qubits: Current State of Play", arXiv:1905.13641v2, pp. 1-28 (Jul. 26, 2019).
Knill, E., et al., "Optimal Quantum Measurements of Expectation Values of Observables," Physical Review A, 7(1), , p. 012328, pp. 1-22 (Jan. 24, 2007).

(56) References Cited

OTHER PUBLICATIONS

Knill, E., et al., "Optimal Quantum Measurements of Expectation Values of Observables", arXiv quant-ph/0607019v1, pp. 1-22 (Jul. 3, 2006).
Kottmann, J.S., et al., "Reducing qubit requirements while maintaining numerical precision for the variational quantum eigensolver: A basis-set-free approach," The Journal of Physical Chemistry Letters 12.1, arXiv:2008.02819, pp. 663-673 (2021).
Krantz, P., et al., "A Quantum Engineer's Guide to Superconducting Qubits", Applied Physics Reviews, vol. 6, No. 2, 021318, pp. 1-59 (2019).
Kühn, M., et al. "Accuracy and Resource Estimations for Quantum Chemistry on a Near-Term Quantum Computer," Journal of Chemical Theory and Computation 15.9, pp. 1-26. arXiv:1812.06814 (Aug. 14, 2019).
Lee, S.J.R., et al., "Analytical Gradients for Projection-Based Wavefunction-in-DFT Embedding", arXiv:1903.05830v3, pp. 1-15 (Aug. 19, 2019).
Lemke, C., et al., "Metalearning: a survey of trends and technologies," Artificial Intelligence Review 44, 117 pp. 1-17 (2015).
Lieb, E.H., and Wu,F.Y., "The one-dimensional Hubbard model: a reminiscence," Physica A: Statistical Mechanics and its Applications 321, 1, arXiv:0207529, pp. 1-33 (2002).
Lin, L, and Tong, Y., "Heisenberg-limited ground state energy estimation for early fault-tolerant quantum computers," arXiv preprint arXiv:2102.11340, pp. 1-24 (Feb. 22, 2021).
Lin, L, and Tong, Y., "Near-optimal ground state preparation," Quantum, 4:372,arXiv:2002.12508, pp. 1-22 (Dec. 6, 2020).
Liu, J., and Wang, L., "Differentiable learning of quantum circuit Born machines", Phys. Rev. A 98, 062324, pp. 1-9 (2018).
Liu, Y., "The Complexity of the Consistency and N-Representability Problems for Quantum States", Quantum Physics, arXiv preprint arXiv:0712.3041, pp. 1-89 (2007).
Liu, Y., et al., "Quantum computational complexity of the N-representability problem: QMA complete", Physical review letters, vol. 98, No. 11, pp. 1-6 (2007).
Long, G.L., et al, "Phase Matching in Quantum Searching", arXiv:quant-ph/9906020v1, pp. 1-13 (Jun. 5, 1999).
Low, G.H., and Chuang, I.L., "Optimal Hamiltonian Simulation by Quantum Signal Processing", arXiv:1606.02685v2, pp. 1-6 (Dec. 20, 2016).
Low, G.H., et al., "Methodology of Resonant Equiangular Composite Quantum Gates", Physical Review X, vol. 6, No. 4, pp. 1-13 (2016).
Manby, F.R., et al., "A simple, exact density-functional-theory embedding scheme", Journal of Chemical Theory and Computation, pp. 2564-2568 (Jul. 17, 2012).
Manrique, D.Z., et al., "Momentum-Space Unitary Coupled Cluster and Translational Quantum Subspace Expansion for Periodic Systems on Quantum Computers," arXiv: 2008.08694 [quant-ph], pp. 1-10 (2021).
Mari, A., et al., "Estimating the gradient and higher-order derivatives on quantum hardware," Phys. Rev. A 103, 012405, pp. 1-17 (Feb. 26, 2021).
Maslov, D., "Basic Circuit Compilation Techniques for an Ion-Trap Quantum Machine", https://arxiv.org/pdf/1603.07678v4, Feb. 21, 2017, pp. 1-18.
McClean, J. R., et al., "The theory of variational hybrid quantum-classical algorithms", New Journal of Physics, vol. 18, Feb. 5, 2016, pp. 1-22.
McClean, J.R., et al., "Decoding quantum errors with subspace expansions," Nat. Comm. 11, p. 636. doi: 10.1038/s541467-020-14341—pp. 1-9 (2020).
McClean, J.R., et al., "Hybrid Quantum-Classical Hierarchy for Mitigation of Decoherence and Determination of Excited States", Physical Review A, vol. 95, No. 4, pp. 1-10 (2017).
McClean, J.R., et al., "OpenFermion: the electronic structure package for quantum computers", Quantum Science and Technology 5.3, p. 034014, pp. 1-22 (2020).

Mølmer, K., and Sørensen, A., "Multiparticle entanglement of hot trapped ions", arXiv:quant-ph/9810040v2, pp. 1-4 (Jan. 26, 1999).
Mostafa H., and Wang X., et al., "Parameter Efficient Training of Deep Convolutional Neural Networks by Dynamic Sparse Reparameterization", arXiv:1902.05967v3, pp. 1-18 (May 13, 2019).
Motta, M., et al., "Low rank representations for quantum simulation of electronic structure", Computational Physics, Quantum Physics, arXiv:1808.02625v2, pp. 1-8 (Aug. 9, 2018).
Nakanishi, K.M., et al., "Subspace-search variational quantum eigensolver for excited states," Phys. Rev. Research 1, p. 033062. doi:10.1103/PhysRevResearch.1.033062-1-7 (3 Oct. 3, 2019).
Nichol, A., et al., "On first-order metal-earning algorithms," arXiv:1803.02999, pp. 1-15 (Oct. 22, 2018).
Nielsen, A. M., et al, "Quantum Computation as Geometry", arXiv:quant-ph/0603161v2, Mar. 21, 2006, pp. 1-13.
Nielsen, M. A., and Chuang, I. L., "Quantum Computation and Quantum Information", Cambridge University Press, pp. 1-704 (2000).
Non-Final Office Action dated Jun. 10, 2021, in U.S. Appl. No. 17/084,990 of Sukin Sim, filed Oct. 30, 2020, 20 pages.
Norm M. Tubman, et al., "Postponing the Orthogonality Catastrophe: Efficient State Preparation for Electronic Structure Simulations on Quantum Devices," Quantum Physics, arXiv:1809.05523, pp. 1-13, Sep. 14, 2018.
Notice of Allowance dated Aug. 12, 2021, in U.S. Appl. No. 17/084,990 of Sukin Sim, filed Oct. 30, 2020, 5 pages.
Notice of Allowance dated Aug. 27 2021, in U.S. Appl. No. 17/084,990 of Sukin Sim, filed Oct. 30, 2020, 5 pages.
Notice of Allowance dated Jun. 28, 2021, for U.S. Appl. No. 17/033,727 of Pierre-Luc Dallaire-Demers, filed Sep. 26, 2020, 32 pages.
O'Gorman, B., et al., Generalized swap networks for near-term quantum computing, arXiv: 1905.05118 [quant-ph]., pp. 1-16 (May 13, 2019).
Panagiotis KI Barkoutsos et al., "Quantum Algorithms for Electronic Structure Calculations: Particle-Hole Hamiltonian and Optimized Wave-Function Expansions," Phys. Rev. A 98, 022322, Aug. 20, 2018, 14 pages.
Peruzzo, A., et al., "A variational eigenvalue solver on a photonic quantum processor", Nature Communications, vol. 5, Article No. 4213, pp. 1-7 (2014).
Peruzzo, A., et al., "A variational eigenvalue solver on a quantum processor", Quantum Physics, arXiv:1304.3061v1, pp. 1-10 (Apr. 10, 2013).
Pino, J.M., et al., "Demonstration of the QCCD trapped-ion quantum computer architecture", arXiv:2003.01293, Sep. 26, 2020, pp. 1-11.
Potthoff, M., "Chapter 1: Self-energy-functional theory", arXiv:1108.2183, Aug. 10, 2011, pp. 1-38.
Purvis, G.D., et al., "A full coupled-cluster singles and doubles model: The inclusion of disconnected triples", The Journal of Chemical Physics, vol. 76, No. 4, pp. 1910-1918 (Feb. 15, 1982).
R. L. Fox et al., "Rates of change of eigenvalues and eigenvectors," AIAA Journal 6.12 (1968), pp. 2426-2429.
Reiher, M., et al., "Elucidating Reaction Mechanisms on Quantum Computers", PNAS, vol. 114, No. 29, pp. 1-28 (2016).
Rice, J.E., et al., "Quantum computation of dominant products in lithium-sulfur batteries," The Journal of Chemical Physics, 154(13):134115, 2021. arxiv2001.01120, pp. 1-7 (Jan. 4, 2020).
Robbins, K., and Love, P.J., "Benchmarking VQE with the LMG model," arXiv: 2105.06761 [quant-ph]. pp. 1-15 (Aug. 2, 2021).
Robert M. Parrish et al. "Psi4 1.1: An Open-Source Electronic Structure Program Emphasizing Automation, Advanced Libraries, and Interoperability," J. Chem. Theory Comput. 13.7 (2017), pp. 3185-3197. doi: 10.1021/acs.jctc.7b00174. url: http://dx.doi.org/10.1021/acs.jctc.7b00174.
Rodriguez-Lujan, I., et al., "Quadratic Programming Feature Selection", The Journal of Machine Learning Research, vol. 11, pp. 1491-1516 (2010).
Rolando D Somma et al., "Spectral gap amplification," SIAM Journal on Computing, 42(2):593-610, 2013. arXiv:1110.2494, Mar. 30, 2012, 14 pages.

(56) References Cited

OTHER PUBLICATIONS

Rolando D Somma, "Quantum eigenvalue estimation via time series analysis," New Journal of Physics, 21(12):123025, 2019. arXiv:1907.11748, Jul. 26, 2019, 10 pages.
Romero et al., "Quantum autoencoders for efficient compression of quantum data", arXiv:1612.02806v2, Feb. 10, 2017, 11 pages. . [retrieved on Jan. 20, 2020]. Retrieved from <https://arxiv.org/abs/1612.02806>.
Romero, J., and Aspuru-Guzik, A., "Variational quantum generators: Generative adversarial quantum machine learning for continuous distributions", Quantum Physics, arXiv:1901.00848 [quant-ph], Jan. 3, 2019, pp. 1-15.
Romero, J., et al., "Quantum autoencoders for efficient compression of quantum data", Quantum Science and Technology, vol. 2 (4):045001, Feb. 10, 2017, pp. 1-10.
Romero, J., et al., "Strategies for quantum computing molecular energies using the unitary coupled cluster ansatz", arXiv:1701.02691v2 [quant-ph], vol. 4, No. 4, pp. 1-18 (Feb. 10, 2018).
Rubin, N. C., et al., "Application of Fermionic Marginal Constraints to Hybrid Quantum Algorithms", New Journal of Physics, vol. 20, No. 5, 053020, pp. 1-21 (2018).
Rubin, N.C., "A Hybrid Classical/Quantum Approach for Large-Scale Studies of Quantum Systems with Density Matrix Embedding Theory", Quantum Physics, arXiv:1610.06910 [quant-ph], pp. 1-10, (2016).
Rusu, A. A., et al., "Meta-learning with latent embedding optimization," arXiv:1807.05960, pp. 1-17 (Mar. 26, 2019).
S. Sim et al., "Adaptive pruning-based optimization of parameterized quantum circuits," Quantum Science and Technology 10.1088/2058-9565/abe107 (2021) 24 pages, arXiv:2010.00629.
Sam McArdle et al., "Digital quantum simulation of molecular vibrations," Chemical science, 10(22):5725-5735, 2019. arXiv:1811.04069, Nov. 9, 2018, 14 pages.
Sarma, S.D., et al., "Majorana Zero Modes and Topological Quantum Computation", arXiv: 1501.02813v2, pp. 1-16, May 14, 2015 (retrieved on Nov. 17, 2019). Retrieved from <https://arxiv.org/abs/1501.02813>.
Schlittgen, B., et al., "Low-Energy Effective Theories of Quantum Spin and Quantum Link Models", Physical Review D, vol. 63. No. 8, pp. 1-29 (Mar. 19, 2001).
Schuch, N. and Verstraete, F., "Computational Complexity of interacting electrons and fundamental limitations of Density Functional Theory", Nature Physics, DOI: 10.1038/NPHYS1370, Aug. 23, 2009, pp. 732-735.
Examination Report dated Dec. 22, 2021, in Canadian patent application No. 3,133,917, 5 pages.

\* cited by examiner

US 11,288,121 B2

SIMULATING ERRORS OF A QUANTUM DEVICE USING VARIATIONAL QUANTUM CHANNELS

BACKGROUND

Quantum computers promise to solve industry-critical problems which are otherwise unsolvable or only very inefficiently addressable using classical computers. Key application areas include chemistry and materials, bioscience and bioinformatics, logistics, and finance. Interest in quantum computing has recently surged, in part due to a wave of advances in the performance of ready-to-use quantum computers.

As quantum computing has developed so has also the need increased for effective ways to benchmark quantum computer capabilities. Benchmarks are useful for cross-comparisons among devices and to give direct feedback for ways to improve device performance. Desiderata for effective benchmarking schemes are architecture independence; scalability, i.e., efficient implementation of for huge number of qubits; and the ability to provide answers to useful experimental questions such as quantifying un-wanted entanglement and determining accuracy of composed gate operations.

Current quantum computing strategies include selecting a particular quantum algorithm and implementing it on a near term quantum device. Benchmarks of this character include using tensor networks, using quantum communication protocols, and using a number of simple quantum circuits to benchmark the device.

Such techniques satisfy the first two desiderata (architecture and scalability). For architecture, the benchmarking techniques involve algorithms that are developed without any specific architecture in mind; and for scalability, the involved algorithms are efficiently implementable on larger devices. Satisfying the third requirement, the ability to provide answers to useful experimental questions, is more difficult to achieve because the above techniques do not inform the experimenter of how to improve the quality of the device. The output might be too noisy to answer useful experimental questions about the device apart from demonstrating that the results are far from being accurate.

More recently, there has been work to answer the question of what it would mean to benchmark a quantum device. The 'quantum volume' metric introduced by IBM removes device dependent features like circuit optimization, parallelization tricks, and connectivity of the device.

Another benchmarking idea introduced by James Wootton uses random circuits for preparing an un-entangled state and then randomly introducing short range entanglement at different locations on the device. The goal is to quantify how well the random gates can be inverted by reviewing the amount of long range entanglement on the device. However, long range entanglement on the device may also be explained by loss of quantum coherence in the quantum system. It may difficult to distinguish between long range entanglement effects and decoherence effects for near-term devices.

What is needed, therefore, are efficient, architecture-independent, and scalable techniques for benchmarking of the quantum computer system that are helpful in diagnosing potential issues with operation of the quantum computer system and accurately inform the experimenter of how to improve the quality of the quantum computer system.

SUMMARY

A hybrid quantum classical (HQC) computer system, which includes both a classical computer component and a quantum computer component, implements benchmarking of a near term quantum device. The quantum device may have physical errors associated with it, and the classical computer component of the HQC computer system may have a processor, a non-transitory computer-readable medium, and computer program instructions stored on the non-transitory computer-readable medium to perform the benchmarking.

The computer program instructions may be executable by the processor to perform the benchmarking by performing a modelling subroutine to simulate the quantum computer device, thus creating a virtual quantum machine (VQM) that acts as a model of the quantum computer device. The VQM is constructed to have associated with it a quantum channel which attempts to reproduce a probability distribution of error syndromes (bit strings that may be used to locate position of errors) of the near term quantum device. The probability distribution of error syndromes of the near term quantum device is reproduced after the state of the quantum computer device is prepared so that state preparation may be assumed to be ideal.

Other features and advantages of various aspects and embodiments of the present invention will become apparent from the following description; from the document entitled "BENCHMARKING OF QUANTUM DEVICES: How To Use Quantum Error Correcting Codes" by Amara Katabarwa, submitted on even date herewith and which is incorporated in and constitute a part of this specification; and from the claims.

BRIEF DESCRIPTION OF THE DRAWINGS

In what follows, embodiments of the invention are explained in more detail with reference to the drawings, in which.

DETAILED DESCRIPTION

Figure 1:
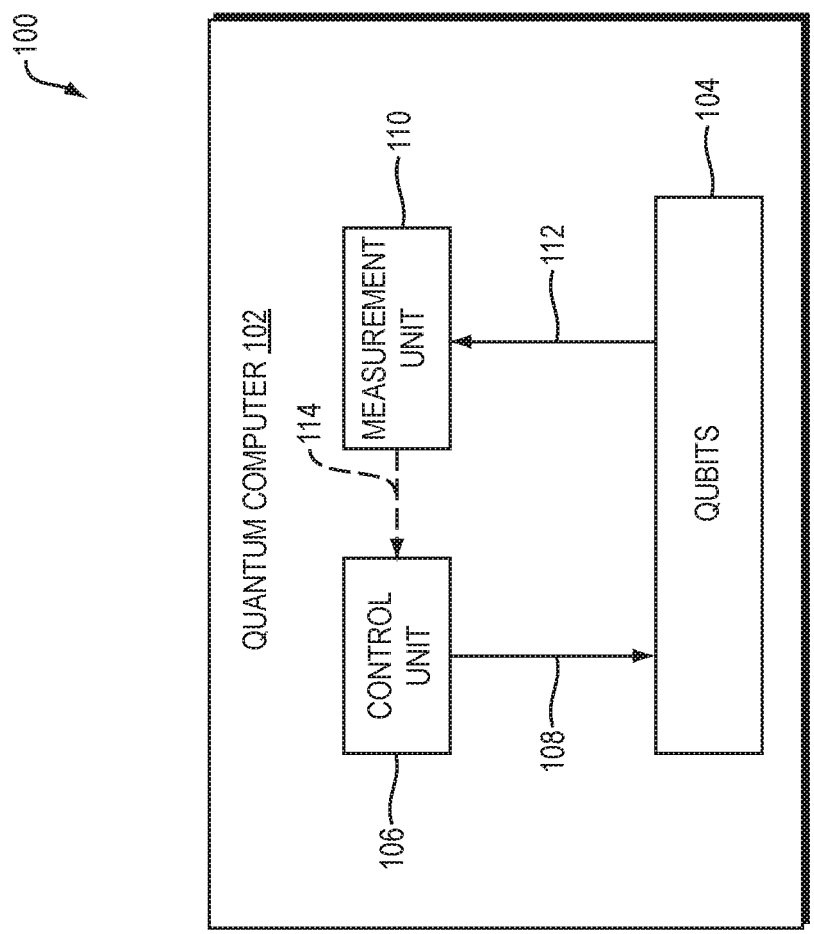
FIG. 1 is a diagram of a quantum computer according to one embodiment of the present invention.

Embodiments of the present invention are directed to a hybrid classical quantum device, which includes both a classical computer component and a quantum device. Such embodiments initialize a quantum device with at least one initial state, and apply a quantum error correcting (QEC) code to the initial state to produce an output distribution. This output distribution is then compared to the output distribution on a simulation of the quantum device on a classical computer. This simulation comprises initializing the same initial states, applying the same QEC code, and additionally applying a simulated variational quantum channel to produce a second output distribution. The parameters of the simulated variational quantum channel are then adjusted to increase the similarity of both output distributions.

The quantum device may have a set of physical errors associated therewith, and the classical computer component of the hybrid quantum classical device may have a processor, a non-transitory computer-readable medium, and computer program instructions stored on the non-transitory computer-readable medium. In some embodiments, the quantum device comprises a programmable quantum computer. In other embodiments, the quantum device comprises a non-computational device such as a photonic quantum network with a system for performing error-correction. Any reference herein to a hybrid quantum classical (HQC) computer should be understood to refer to a device that includes a classical computer and a quantum device where the quantum device may or may not be a computer.

The computer program instructions may be executable by the processor to perform the benchmarking by causing the classical computer component to perform a modelling subroutine to simulate the near-term quantum device, thus creating a virtual quantum machine (VQM) to act as a model of the near-term quantum device. The modelling subroutine may perform the modelling by generating data representing the VQM based on data representing the near-term quantum device.

The computer program instructions may also be executable by the processor to cause the classical computer component to indirectly benchmark the near-term quantum device by directly benchmarking the VQM with quantum error correction (QEC) tools to obtain data representing a probability distribution of error syndromes for the VQM. Further, the computer program instructions may also cause the classical computer component to produce a probability distribution of error syndromes for the near-term quantum computer device based on the data representing the benchmarking results for the VQM. In certain embodiments, the data representing the probability distribution of error syndromes for the VQM may be used as the data representing the probability distribution of error syndromes for the quantum computer device.

It may be desirable to develop a quantum computer component smaller than the near-term quantum device (i.e., having fewer qubits than the near-term quantum device) in order to simulate the operation of the near-term quantum device. In still further embodiments, the set of simulated errors developed for modelling the VQM may be used to simulate the set of physical errors associated with the near-term quantum device on the smaller quantum computer component.

Error detection and correction techniques have been useful in controlling errors in data over unreliable or noisy communication channels in classical computer/telecommunication systems. Some error detection and correction techniques employ error correcting codes that may be used to reconstruct original error-free data. Information may be encoded with an error correcting code that allows a receiver to detect and often correct a limited number of errors that may occur anywhere in the information.

The error correcting codes used in classical error detection and correction techniques may form the basis for quantum error correcting codes, which may then be used to develop benchmarking techniques that inform the experimenter of how to improve the quality of the quantum computer system and diagnose potential issues with operation of the quantum computer system.

Calculation of certain properties of quantum error correcting codes as applied to a quantum device may yield information about the noise processes of a quantum device. For example, by studying the properties of entangled states from the quantum error correcting code, one can investigate entanglement properties of the code, entropic quantities, and error rates produced by the device.

Figure 4:
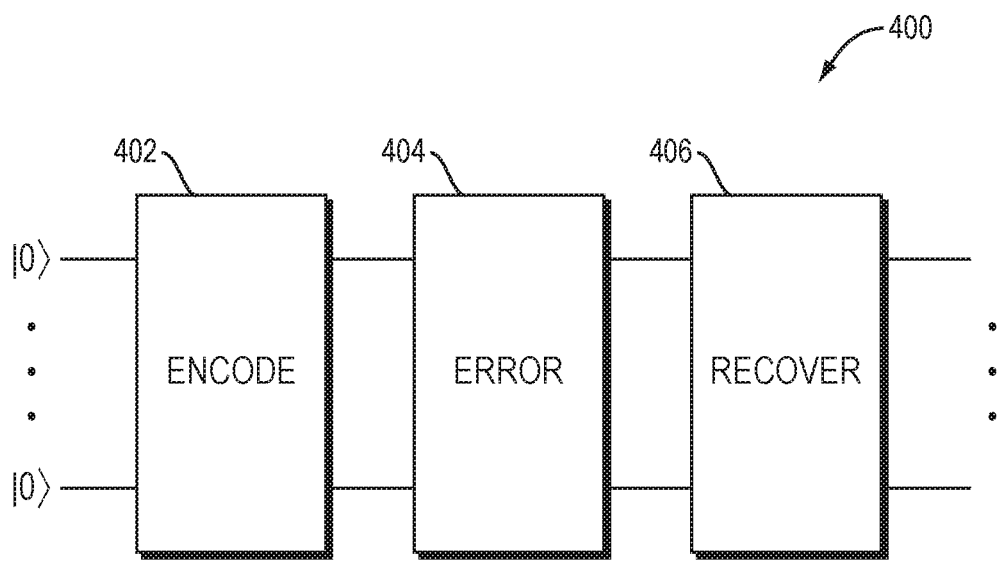
FIG. 4 is a schematic of a conventional error correcting technique for an encoded device for which perfect encoding is assumed.

A typical error correcting technique for an encoded device for which perfect encoding is assumed is shown diagrammatically in FIG. 4, in which an error correction system 400 has an encoding stage 402, an error-producing stage 404, and an error-recovery stage 406. Inputs to the error correction system 400 include an all zero quantum state of a quantum system of interest, $|0\rangle \ldots |0\rangle$, which is input to the encoding box 402. An ideal unitary UEncode, comprising a selected number of unitary operators, may be applied to the all zero quantum state to perfectly prepare the all zero quantum state in a code subspace. The perfectly prepared quantum state may be input to an execution stage 404, in which at least one operation is performed on the perfectly prepared quantum state, during which errors occur in the perfectly prepared quantum state. The now-faulty quantum state may be input to the error-recovery stage 406, in which recovery operations may performed on the faulty quantum state to remove the errors.

Figure 5:
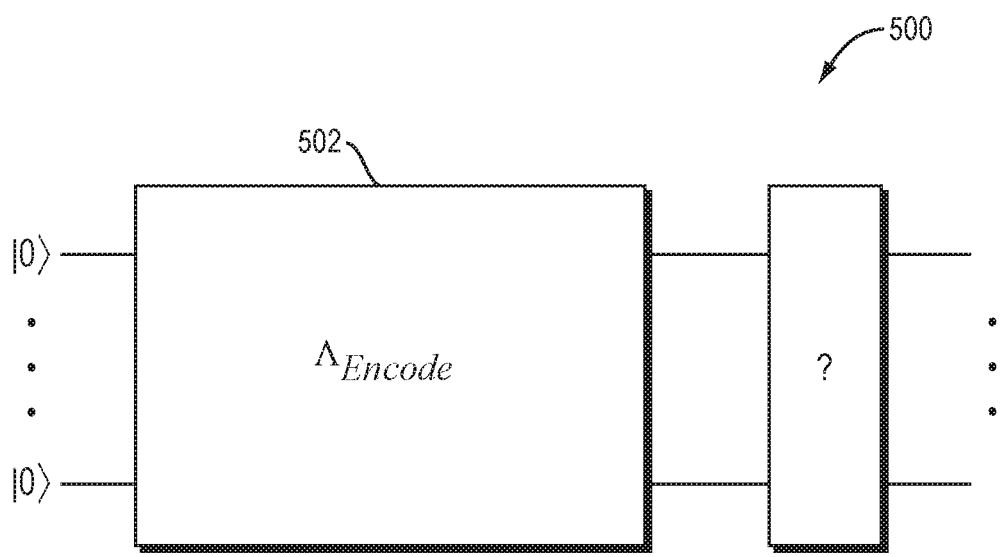
FIG. 5 is a schematic of an error correcting technique for a near term quantum device according to one embodiment of the present invention.

Near term quantum devices do not possess perfect encoding as assumed in the quantum system of FIG. 4. An error correcting technique for a near term quantum device (in which perfect encoding is not assumed) is shown diagrammatically in FIG. 5, in which an error correction system 500 has an encoding stage 502, in which, in place of the ideal unitary UEncode, a non-unitary quantum channel $\Lambda$Encode may be applied to the all zero quantum state to prepare the quantum state. $\Lambda$Encode is not unitary precisely because, in general, the noise, acting in the encoding stage 202, is not a unitary operation but instead a completely positive trace preserving map.

Benchmarking Quantum Devices

Defining a Virtual Quantum Machine (VQM)

An embodiment of benchmarking quantum devices with quantum error codes comprises generating data representing a virtual quantum machine (VQM) for use as a proxy for benchmarking a real quantum device, in which the real quantum device is indirectly benchmarked by directly benchmarking the VQM with quantum error correcting code. The VQM is defined to ensure that the quantum state has been prepared perfectly so that errors introduced to the quantum state either through imperfect operations or imperfect qubits occur only after a perfect encoding. This property of the VQM enables us to validly apply the tools from the theory of quantum error correction for the purposes of benchmarking. The amount of error introduced on the VQM should reflect the amount of error occurring in the encoding stage 502 on the real quantum device. That is to say, if perfect encoding were applied on the real device, then any algorithm that is used on the VQM should introduce no error in the VQM after the encoding stage. On the other hand, if preparing the all zero quantum state on the real quantum device in the encoding stage 502 is extremely noisy, resulting in a large amount of error occurring in the output, then corresponding error should be introduced into the VQM after the encoding stage 502.

Because, as part of the modeling process, the VQM, as proxy to the real quantum device, is provided with the error characteristics associated with the real quantum device, directly benchmarking the VQM operates to indirectly benchmark the real quantum device.

The tools used to directly benchmark the VQM may be the tools that have been developed to perform quantum error correction. The quantum error correction tools may be any suitable error correction tools, including conventional tools; and the measurements produced by the quantum error correction tools may be used not only to produce a probability distribution of the error syndromes for the VQM and the real quantum device (imperfect by definition), but also to perform error correction of the measurements that produce a probability distribution of the error syndromes are made that may be used for error recovery on the imperfect device.

Error Recovery

In one embodiment, error recovery may proceed using the following process.

In a quantum error correction stage: With the quantum computer component, attempt to create state $\psi$ in the code subspace on the real quantum device;

With the quantum computer component, perform a quantum non-demolition measurement of stabilizers of the quantum error correction code of the near term quantum device to obtain a probability distribution of error syndromes $p(\vec{s}|U_L)$ that is associated with the near term quantum device, where $U_L$ is a logical operator (for example, an operator that makes the one logical state from the zero logical state);

With the classical computer component, create a state on the VQM (which has been modelled classically in a simulation) that assumes perfect encoding of the state in the code subspace of the quantum error correcting code. Then identify parameters that reproduce the probability distribution $p(\vec{s}|U_L)$ for association with the VQM.

Constructing the Variational Quantum Channel

In one embodiment, parameters that reproduce the probability distribution $p(\vec{s}|U_L)$ may be identified by defining a variational quantum channel and searching for parameters of the variational quantum channel that reproduce the probability distribution. In one embodiment, a variational quantum channel may be defined as the tunable sequence of gates of the VQM that provide the VQM with measured statistics that match those of the real quantum device.

In one embodiment of the process for developing the VQM as a model for the real quantum device, a quantum channel may be defined to model the error process on the VQM; with the optimal parameters of the quantum channel determined by tuning gates of the virtual quantum machine such that the measured statistics of the virtual quantum machine match that of the real quantum device. A variational quantum channel may then be defined to be the tunable sequence of gates that provide the matching measured statistics.

Figure 6A:
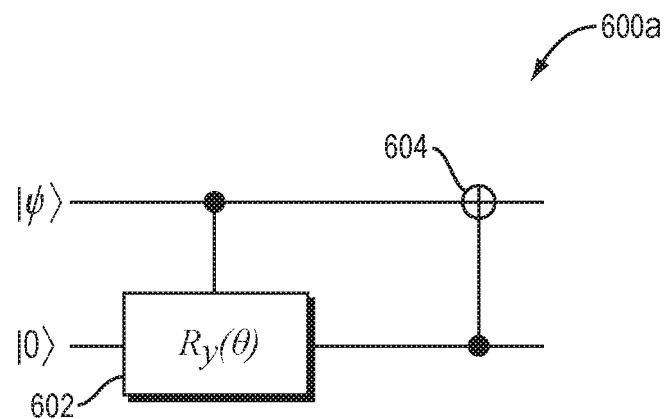
FIGS. 6A and 6B are schematics of operations for creating the variational quantum channel quantum circuit according to one embodiment of the present invention.
Figure 6B:
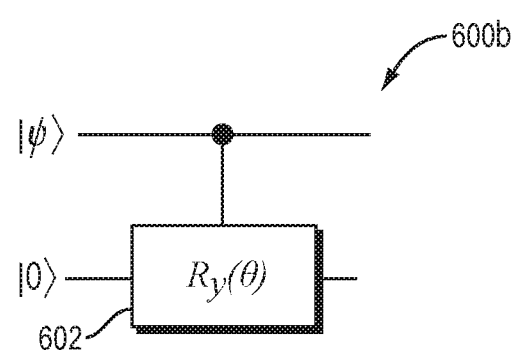

In one embodiment, shown in FIGS. 6A and 6B, the variational quantum channel may be constructed as shown by applying a controlled Y rotation 602 on an ancilla qubit 600a, and then applying a controlled not operation 604 on the qubit. Performing a partial trace of the Hilbert Space of the ancilla qubit (by throwing away the ancilla qubit as shown as 600b in FIG. 6B) applies Kraus operators to the qubit state on the VQM so that the qubit on the VQM is left in $E_0\psi^+\psi E_0^+ + E_1\psi^+\psi E_1^+$ with $E_0, E_1$ being Kraus operators of the form:

$$E_0 = \begin{pmatrix} 1 & 0 \\ 0 & \cos\theta_a \end{pmatrix}$$

$$E_1 = \begin{pmatrix} 0 & \sin\theta_a \\ 0 & 0 \end{pmatrix}$$

The composition of the two operations in FIGS. 3A-3B constitutes the variational quantum channel applied to the qubit (top quantum state in both figures).

Increasing Two Qubit Gate Fidelity

It may be seen that there will be unitary errors from the imperfect implementation of the single and two qubit gates on the near term quantum device, but that the variational quantum channel constructed as described above is only sensitive to non-unitary processes. The variational quantum channel allows for tuning of two sets of parameters to mimic the combined effects of non-unitary processes but parameters that come from unitary processes can't be captured by the variational quantum channel. Therefore, the bulk of these unitary errors will come from the two qubit gates.

In one embodiment, the unitary errors may be addressed by defining the variational quantum channel on the VQM with variational unitary gates so that the optimization process performed to match the probability distribution is sensitive to both unitary and non-unitary processes. While the approach will be effective, complexity of the optimization process is increased because introducing variational unitary gates on the variational quantum channel increases the number of parameters over which the optimization is performed.

In another embodiment, the unitary errors may be addressed by suppressing the unitary errors from two qubits gates on the real near term quantum device so that whatever parameters needed to describe the probability distribution of the error syndromes may be assumed to be mostly described by parameters from non-unitary processes. In one embodiment, the unitary errors suppression may be accomplished by identifying pulse shapes for the two qubits which improve the two qubit gate fidelity or by algorithmically improving the fidelity of the two qubit gates, where gate fidelity denotes a degree of closeness to ideal to which the gate operates.

Unitary errors suppression allows the optimization process to be separated into two separate parts. Using a variant of "Variational Quantum Gate Optimization" introduced by Kentaro Heya et al., the two qubit gates may be "dressed" with local single qubit rotations; and angles may be identified that improve the fidelity of the two qubit gates. As a result, the probability distribution on the error syndrome from the real near term quantum device either may be described by parameters only from non-unitary processes or may depend very weakly on parameters from unitary processes.

The variational quantum channel operates to attempt to mimic the probability distribution of errors obtainable by all kinds of non-unitary processes on the near-term quantum device, including but not limited to relaxation, dephasing and measurement errors. Thus, the parameters of the variational quantum channel that reproduce the probability distribution will not have simple physical interpretations like time for relaxation or dephasing.

An advantage of developing a quantum channel that reproduces the probability distribution of errors rather than simply identifying the probability distribution for errors on the near-term quantum device is additional information may be identified, such as a probability distribution of Pauli errors. Also, since benchmarking on the near-term quantum device is conducted indirectly, state preparation and measurement (spam) errors that may be introduced on the real quantum device may be ignored. Being virtual, the VQM has no SPAM errors but reproduces a probability distribution from a device that does. Thus, figure of merits may be used for benchmarking the VQM such as logical error rates or the entropy of the quantum error correcting code with a physically motivated quantum channel.

Setting Up a Benchmarking Protocol

One embodiment of a benchmarking protocol has a portion that is performed on the near-term quantum device and another portion that is performed on the VQM. The benchmarking protocol may be set up according to the process 400:

Benchmarking Protocol on the Near-Term Quantum Device

QEC codes, QEC1, QEC2 may be selected to correct for an arbitrary single qubit error. In one embodiment, QEC1=QEC2, and the benchmarking protocol may be performed on the near-term quantum device as follows:

In a first stage, a quantum state may be prepared from a code subspace obtained by concatenating QEC1 on the quantum device. Concatenated codes are error-correcting codes that are constructed from two or more simpler codes in order to achieve good performance with reasonable complexity. Concatenated codes are formed by combining an inner code and an outer code. For example, the Steane code uses several physical qubits to prepare one logical qubit stored on an entangled state of seven physical qubits. Concatenating the Steane code twice would mean getting seven sets or blocks of seven physical qubits making a logical qubit from each set or block. Logical operations may then be used to create one more abstract logical qubit from seven logical qubits or on 49 physical qubits. The seven logical qubits each created from seven physical qubits constitute the "inner layer" of the QEC while the logical qubit created from the seven logical qubits constitutes the "outer layer".

In a second step, the kth block of the inner layer of the concatenated error-correcting code may be selected and a logical operation $U_L^k$ corresponding to the kth block may be applied to the kth block. The logical operation may be any logical operation such as a logical NOT operation, and it may be applied on many qubits. For the Steane code pf the previous example, the logical NOT operation acts on seven qubits; in fact, the logical NOT operation is simply a NOT operation acting on all seven physical qubits.

In a third step, stabilizers $S_i^k$ of the inner layer (where i refers to the stabilizer and k refers to the block) may be measured. The stabilizers all commute and therefore may be measured at the same time with help of ancilla qubits. The ancilla qubits will provide a string of ones and zeros, the string representing the error syndromes of the kth block. When a state is prepared in the code subspace and the code is non-degenerate, each string of ones and zeros may be mapped to a particular location of an error on the kth block. Moreover the map is bijective. A record of the error syndrome outcomes (sj) may be made and stored to form the probability distribution $Pr(s_j|U_L^k)$ of the error syndromes of the kth block.

The third and fourth steps then may be repeated for the stabilizers for the (k+1)th block.

When the probability distribution for each block has been generated, they may be used to find variational quantum channels for each block, after which the tools of the theory of quantum error correction may be used to benchmark each block.

Benchmarking Protocol on the VQM

The portion of the benchmarking protocol that on the VQM is performed to model the kth block from the inner layer of the QEC from the real quantum device. Returning to the Steane code and its 49 qubit entangled state on the near-term quantum device, the VQM may have a seven qubit entangled state of the Steane code. As shown diagrammatically in FIGS. 7A-7C, one process for developing a model of error syndromes for use in a benchmarking protocol involves modelling the kth block from the inner layer of the QEC from the real quantum device on the VQM may be performed using the following process.

Figure 7A:
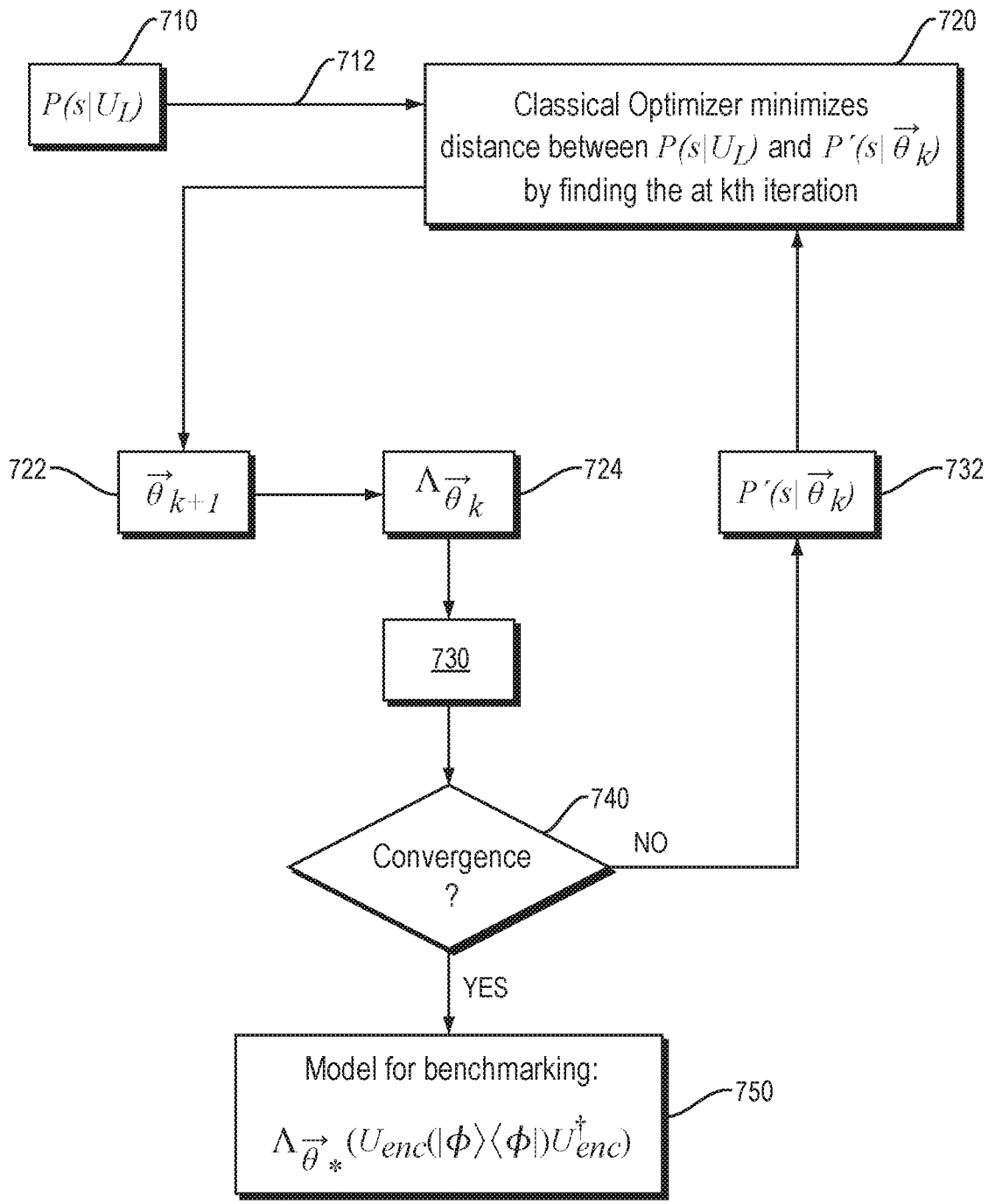
FIGS. 7A-7C are flowcharts showing a process for developing a model of error syndromes for use in a benchmarking protocol according to one embodiment of the present invention.
Figure 7B:
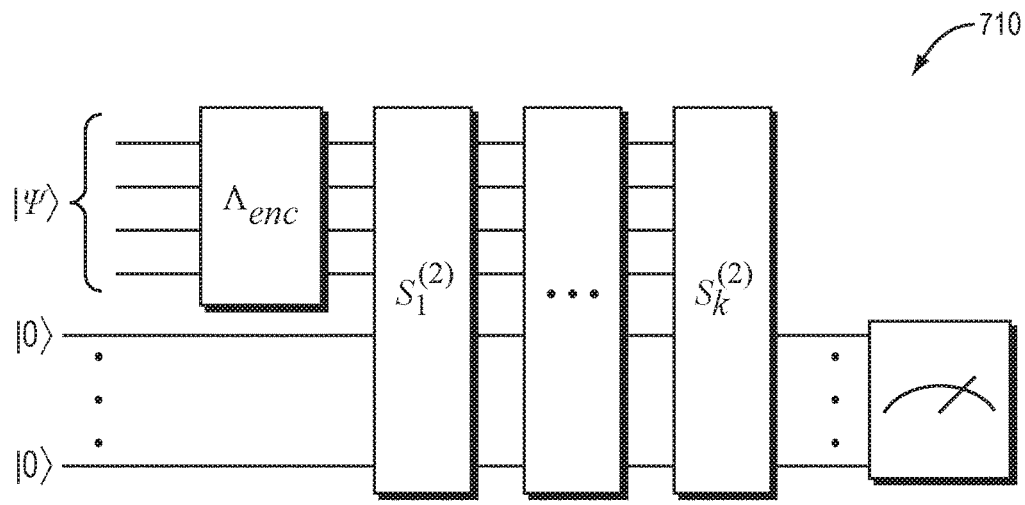
Figure 7C:
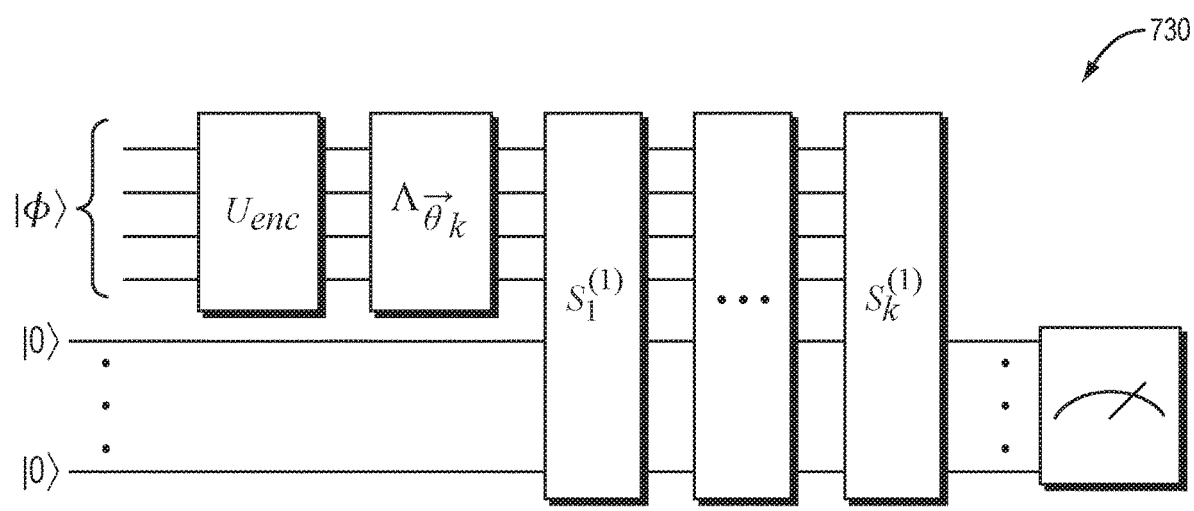

The overview of the process 700 is shown in FIG. 7A. In a first stage, a variational quantum channel circuit 710 Circ($\vec{\theta}$) (shown in greater detail in FIG. 7B) may be defined with the vector $\vec{\theta} = (\theta_1, \theta_2 \ldots \theta_m)$. In a second stage, the stabilizers Si of the quantum error correcting code QEC1 may be measured to obtain outcomes xi from data qubits and produce the output 712 of probability distribution $Pr(x_i|Circ(\vec{\theta}))$. As the embodiments shown here, for the kth block in the inner layer, Si is the same as the stabilizer $S_i^k$ of the inner layer of the QEC).

In a third stage, the vector $\vec{\theta}$ and $Pr(x_i|Circ(\vec{\theta}))$ are input into a classical optimizer 720 such as one available on the classical computer component. The optimizer may be any suitable optimizer such as the NELDER MEAD technique or the COBYLA technique, and generates the output 722, $\vec{\theta}'$, from which the non-unitary quantum channel 724 may be created. The non-unitary quantum channel 724 may be input to the VQM 730 (shown in greater detail in FIG. 7C) to create the probability distribution 432 $Pr(x_i|Circ(\vec{\theta}'))$. The probability distribution 732 $Pr(x_i|Circ(\vec{\theta}'))$ is input into the classical optimizer 720 to bring the probability distribution 732 $Pr(x_i|Circ(\vec{\theta}'))$ into a closer match with the unitaries' probability distribution $Pr(s_j|U_L^k)$. Closeness may be determined with a distance measure on the space of probability distributions; the optimizer may search for parameters for the variational quantum channel such that the two probabilities are not very far apart. An example of a distance measure may be the Bures distance. In certain embodiments, closeness may constitute convergence. A test 740 is conducted to determine if the two probabilities are sufficiently close. If they are not, the probability distribution $\Pr(x_i|\text{Circ}(\vec{\theta}\,'))$ is input into the near-term quantum device circuit 730, the process is repeated and the test 740 is conducted again. If the two probabilities are sufficiently close, the probability distribution $\Pr(x_i|\text{Circ}(\vec{\theta}\,'))$ is output 750 as the model for use in benchmarking.

Figure 8:
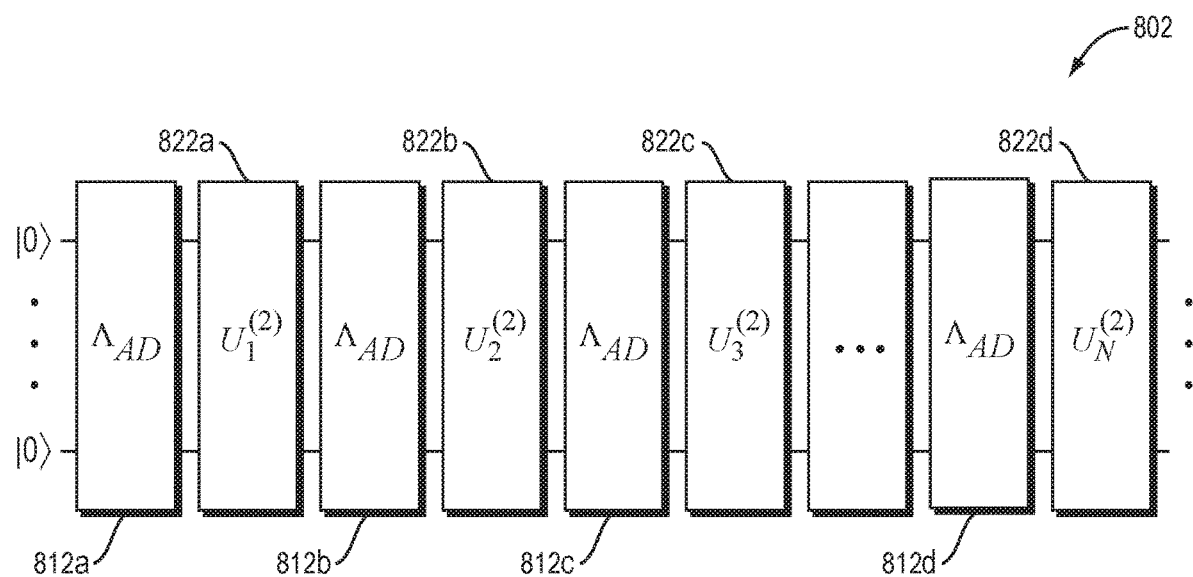
FIG. 8 is a schematic of an encoding stage 202 on the near term quantum device of FIG. 5.

FIG. 8 depicts an encoding stage 802, in which an assumption is made that all error processes may be modeled by amplitude damping. The blocks 812a-d constitute an amplitude damping channel, and the blocks 822a-d represent unitaries, which, as shown by them bearing the superscript 2, may be used to construct a two layer concatenation.

Figure 9:
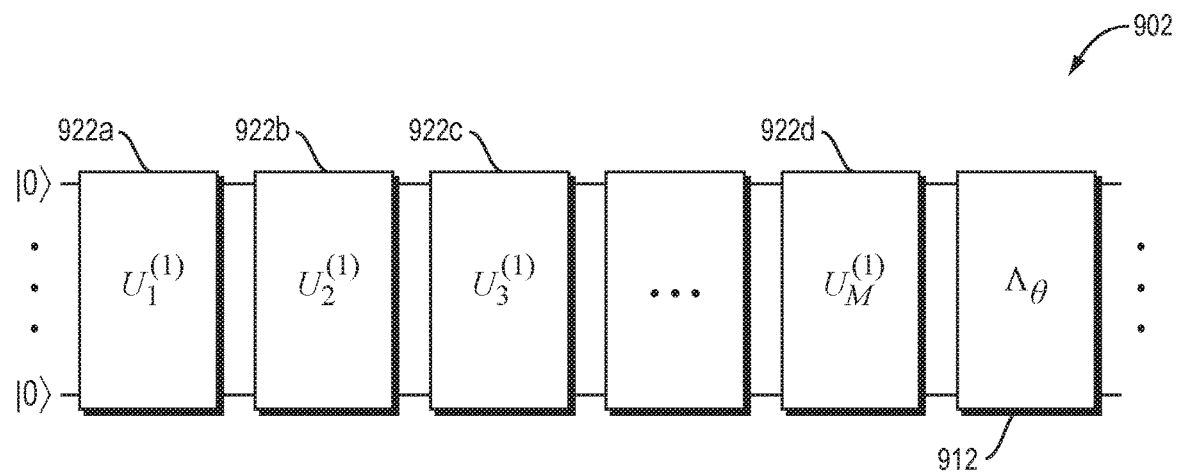
FIG. 9 is a schematic of an encoding stage 602 with perfect quantum encoding for reproducing probability of syndrome outcomes according to one embodiment of the present invention.

FIG. 9 depicts an encoding stage 902 with perfect quantum encoding. The block 912 constitutes a variational amplitude damping channel, as is described above with reference to the construction of a VQM, for reproducing the probability of syndrome outcomes from the quantum device for the kth block or the kth logical state. The blocks 922 represent unitaries, which, as shown by them bearing the superscript 1, may be used to act on the first layer of the concatenation (the encoding stage 902 happening on a lower dimensional Hilbert space).

It may be seen that the embodiments of benchmarking techniques for quantum computer systems disclosed here may be used to greatly improve cross-comparisons among devices and the ability to give direct feedback for ways to improve device performance. Specifically, the embodiments satisfy all three of the above-described desiderata for effective benchmarking schemes:

Architecture independence: the theory of QEC may be developed to be architecture independent.

Scalability: Using concatenation of quantum error correcting codes comes the possibility of entangling qubits throughout the whole of the device. Using code concatenation as a bootstrap allows information about operating quality of the whole device (irrespective of size) to be obtained from local measurement data.

Physically meaningful numbers: By calculating certain properties of quantum error correcting codes, information may be gained about the noise processes of the device. By studying the properties of entangled states from the quantum error correcting codes, information may be gained about entanglement properties of the code, entropic quantities, and error rates produced by the device.

The embodiments of benchmarking techniques for quantum computer systems disclosed here may be used to attaching a logical error rate to the performance of near term quantum devices. Logical error rates for near term devices are not calculable since quantum error correcting codes cannot be reliably implemented.

Moreover, since the disclosed embodiments of benchmarking techniques for quantum computer systems allow for attaching logical error rates to different logical blocks which could correspond to different physical regions of the device, the benchmarking tool provides information about which regions are more problematic, and diagnoses useful features of these error sources. For example, the disclosed procedures allow for development of different models of the noise for each block of the QEC, the models containing in them different probability distributions for X, Y, Z errors.

Further, the disclosed embodiments allow for error mitigation for black box users of near term quantum devices. Experimentalists having fine grained knowledge of how a near term quantum device works are able to apply error mitigation techniques specific to their device, which is not usually the case for black box or cloud users. The disclosed variational quantum channel technique allows users of near term quantum devices to determine effective quantum channels for various processes without performing detailed experiments. Such determinations could then inform an error mitigation protocol that requires as input specific knowledge about the dominant sources of error.

Figure 10:
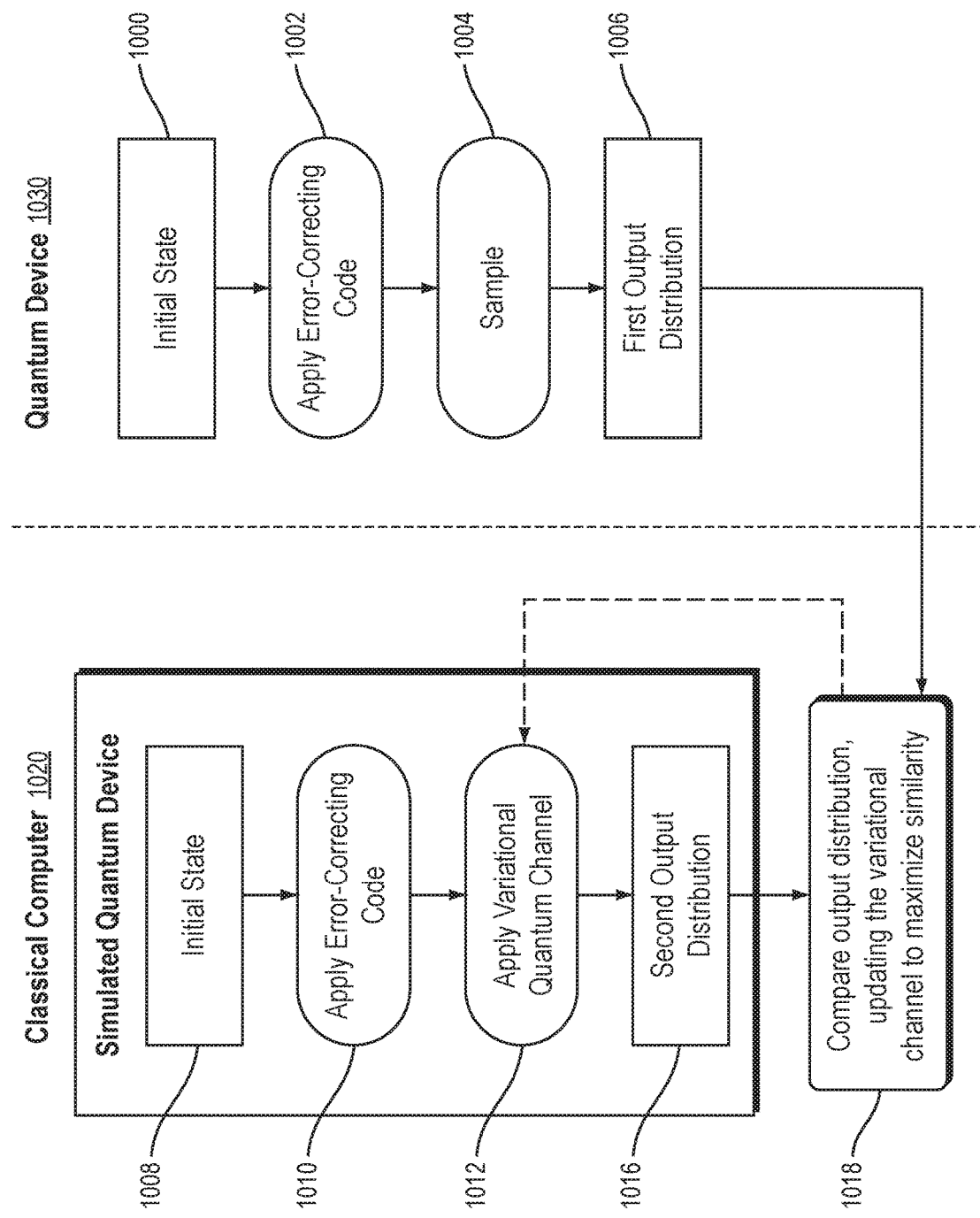
FIG. 10 is a diagram illustrating the use of a hybrid quantum-classical computer to simulate errors of a quantum device using variational quantum channels according to one embodiment of the present invention.

Referring to FIG. 10, a diagram is shown which illustrates the use of a hybrid quantum-classical device to simulate errors of a quantum device 130 using variational quantum channels according to one embodiment of the present invention. The hybrid quantum-classical device includes a classical computer 1020 and a quantum device 1030. The classical computer 1020 includes at least one processor and at least one non-transitory computer-readable medium having computer program instructions being executable by the at least one processor. When the computer program instructions are performed by the at least one processor, they cause the classical computer 1020 to perform a method comprising: (A) initializing 1000 the quantum device 1030 with at least one initial state (e.g., a plurality of initial states); (B) applying 1002 a quantum error correcting (QEC) code to the quantum device 1030 in the at least one initial state to produce a first output distribution 1006; (C) sampling 1004 the first output distribution; (D) simulating, on the classical computer, the first output distribution of the quantum device, the simulating comprising: (1) initializing 1008 a simulation of the quantum device 1030 on the classical computer 1020 with the at least one initial state; (2) applying 1010 the QEC code to the simulation of the quantum device 1030; (3) applying 1012 a simulated variational quantum channel to the simulation of the quantum device 1030 to produce a second output distribution 1016; and (E) adjusting 1018 parameters of the simulated variational quantum channel to increase (e.g., maximize) the similarity of the first and second output distributions.

Adjusting the parameters may include adjusting parameters of the simulated variational quantum channel to optimally match the first output distribution. Adjusting the parameters may include comparing the first output distribution to the second output distribution and adjusting the parameters based on the comparison (e.g., based on a difference between the first output distribution and the second output distribution).

The simulated quantum device may, for example, be a simulated programmable quantum computer. The simulated quantum device may, for example, be a simulated quantum annealer. The simulated quantum device may, for example, be a simulated photonic quantum computer, and the QEC may, for example, be a quantum repeater.

The quantum device 1030 may, for example, be a quantum computer which includes a plurality of qubits. The method of FIG. 10 may further including using the simulated variational quantum channel to determine improvements to fidelities of two-qubit gates in the quantum computer.

The method may further include: (F) before (B), selecting the QEC code based on error modes of the quantum device.

The method may further include: (F) selecting the QEC code based on error modes of the quantum device.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

Various physical embodiments of a quantum computer are suitable for use according to the present disclosure. In general, the fundamental data storage unit in quantum computing is the quantum bit, or qubit. The qubit is a quantum-computing analog of a classical digital computer system bit. A classical bit is considered to occupy, at any given point in time, one of two possible states corresponding to the binary digits (bits) 0 or 1. By contrast, a qubit is implemented in hardware by a physical medium with quantum-mechanical characteristics. Such a medium, which physically instantiates a qubit, may be referred to herein as a "physical instantiation of a qubit," a "physical embodiment of a qubit," a "medium embodying a qubit," or similar terms, or simply as a "qubit," for ease of explanation. It should be understood, therefore, that references herein to "qubits" within descriptions of embodiments of the present invention refer to physical media which embody qubits.

Each qubit has an infinite number of different potential quantum-mechanical states. When the state of a qubit is physically measured, the measurement produces one of two different basis states resolved from the state of the qubit. Thus, a single qubit can represent a one, a zero, or any quantum superposition of those two qubit states; a pair of qubits can be in any quantum superposition of 4 orthogonal basis states; and three qubits can be in any superposition of 8 orthogonal basis states. The function that defines the quantum-mechanical states of a qubit is known as its wavefunction. The wavefunction also specifies the probability distribution of outcomes for a given measurement. A qubit, which has a quantum state of dimension two (i.e., has two orthogonal basis states), may be generalized to a d-dimensional "qudit," where d may be any integral value, such as 2, 3, 4, or higher. In the general case of a qudit, measurement of the qudit produces one of d different basis states resolved from the state of the qudit. Any reference herein to a qubit should be understood to refer more generally to an d-dimensional qudit with any value of d.

Although certain descriptions of qubits herein may describe such qubits in terms of their mathematical properties, each such qubit may be implemented in a physical medium in any of a variety of different ways. Examples of such physical media include superconducting material, trapped ions, photons, optical cavities, individual electrons trapped within quantum dots, point defects in solids (e.g., phosphorus donors in silicon or nitrogen-vacancy centers in diamond), molecules (e.g., alanine, vanadium complexes), or aggregations of any of the foregoing that exhibit qubit behavior, that is, comprising quantum states and transitions therebetween that can be controllably induced or detected.

For any given medium that implements a qubit, any of a variety of properties of that medium may be chosen to implement the qubit. For example, if electrons are chosen to implement qubits, then the x component of its spin degree of freedom may be chosen as the property of such electrons to represent the states of such qubits. Alternatively, the y component, or the z component of the spin degree of freedom may be chosen as the property of such electrons to represent the state of such qubits. This is merely a specific example of the general feature that for any physical medium that is chosen to implement qubits, there may be multiple physical degrees of freedom (e.g., the x, y, and z components in the electron spin example) that may be chosen to represent 0 and 1. For any particular degree of freedom, the physical medium may controllably be put in a state of superposition, and measurements may then be taken in the chosen degree of freedom to obtain readouts of qubit values.

Certain implementations of quantum computers, referred as gate model quantum computers, comprise quantum gates. In contrast to classical gates, there is an infinite number of possible single-qubit quantum gates that change the state vector of a qubit. Changing the state of a qubit state vector typically is referred to as a single-qubit rotation, and may also be referred to herein as a state change or a single-qubit quantum-gate operation. A rotation, state change, or single-qubit quantum-gate operation may be represented mathematically by a unitary 2×2 matrix with complex elements. A rotation corresponds to a rotation of a qubit state within its Hilbert space, which may be conceptualized as a rotation of the Bloch sphere. (As is well-known to those having ordinary skill in the art, the Bloch sphere is a geometrical representation of the space of pure states of a qubit.) Multi-qubit gates alter the quantum state of a set of qubits. For example, two-qubit gates rotate the state of two qubits as a rotation in the four-dimensional Hilbert space of the two qubits. (As is well-known to those having ordinary skill in the art, a Hilbert space is an abstract vector space possessing the structure of an inner product that allows length and angle to be measured. Furthermore, Hilbert spaces are complete: there are enough limits in the space to allow the techniques of calculus to be used.)

A quantum circuit may be specified as a sequence of quantum gates. As described in more detail below, the term "quantum gate," as used herein, refers to the application of a gate control signal (defined below) to one or more qubits to cause those qubits to undergo certain physical transformations and thereby to implement a logical gate operation. To conceptualize a quantum circuit, the matrices corresponding to the component quantum gates may be multiplied together in the order specified by the gate sequence to produce a 2n×2n complex matrix representing the same overall state change on n qubits. A quantum circuit may thus be expressed as a single resultant operator. However, designing a quantum circuit in terms of constituent gates allows the design to conform to a standard set of gates, and thus enable greater ease of deployment. A quantum circuit thus corresponds to a design for actions taken upon the physical components of a quantum computer.

A given variational quantum circuit may be parameterized in a suitable device-specific manner. More generally, the quantum gates making up a quantum circuit may have an associated plurality of tuning parameters. For example, in embodiments based on optical switching, tuning parameters may correspond to the angles of individual optical elements.

In certain embodiments of quantum circuits, the quantum circuit includes both one or more gates and one or more measurement operations. Quantum computers implemented using such quantum circuits are referred to herein as implementing "measurement feedback." For example, a quantum computer implementing measurement feedback may execute the gates in a quantum circuit and then measure only a subset (i.e., fewer than all) of the qubits in the quantum computer, and then decide which gate(s) to execute next based on the outcome(s) of the measurement(s). In particular, the measurement(s) may indicate a degree of error in the gate operation(s), and the quantum computer may decide which gate(s) to execute next based on the degree of error. The quantum computer may then execute the gate(s) indicated by the decision. This process of executing gates, measuring a subset of the qubits, and then deciding which gate(s) to execute next may be repeated any number of times. Measurement feedback may be useful for performing quantum error correction, but is not limited to use in performing quantum error correction. For every quantum circuit, there is an error-corrected implementation of the circuit with or without measurement feedback.

Some embodiments described herein generate, measure, or utilize quantum states that approximate a target quantum state (e.g., a ground state of a Hamiltonian). As will be appreciated by those trained in the art, there are many ways to quantify how well a first quantum state "approximates" a second quantum state. In the following description, any concept or definition of approximation known in the art may be used without departing from the scope hereof. For example, when the first and second quantum states are represented as first and second vectors, respectively, the first quantum state approximates the second quantum state when an inner product between the first and second vectors (called the "fidelity" between the two quantum states) is greater than a predefined amount (typically labeled $\epsilon$). In this example, the fidelity quantifies how "close" or "similar" the first and second quantum states are to each other. The fidelity represents a probability that a measurement of the first quantum state will give the same result as if the measurement were performed on the second quantum state. Proximity between quantum states can also be quantified with a distance measure, such as a Euclidean norm, a Hamming distance, or another type of norm known in the art. Proximity between quantum states can also be defined in computational terms. For example, the first quantum state approximates the second quantum state when a polynomial time-sampling of the first quantum state gives some desired information or property that it shares with the second quantum state.

Not all quantum computers are gate model quantum computers. Embodiments of the present invention are not limited to being implemented using gate model quantum computers. As an alternative example, embodiments of the present invention may be implemented, in whole or in part, using a quantum computer that is implemented using a quantum annealing architecture, which is an alternative to the gate model quantum computing architecture. More specifically, quantum annealing (QA) is a metaheuristic for finding the global minimum of a given objective function over a given set of candidate solutions (candidate states), by a process using quantum fluctuations.

Figure 2A:
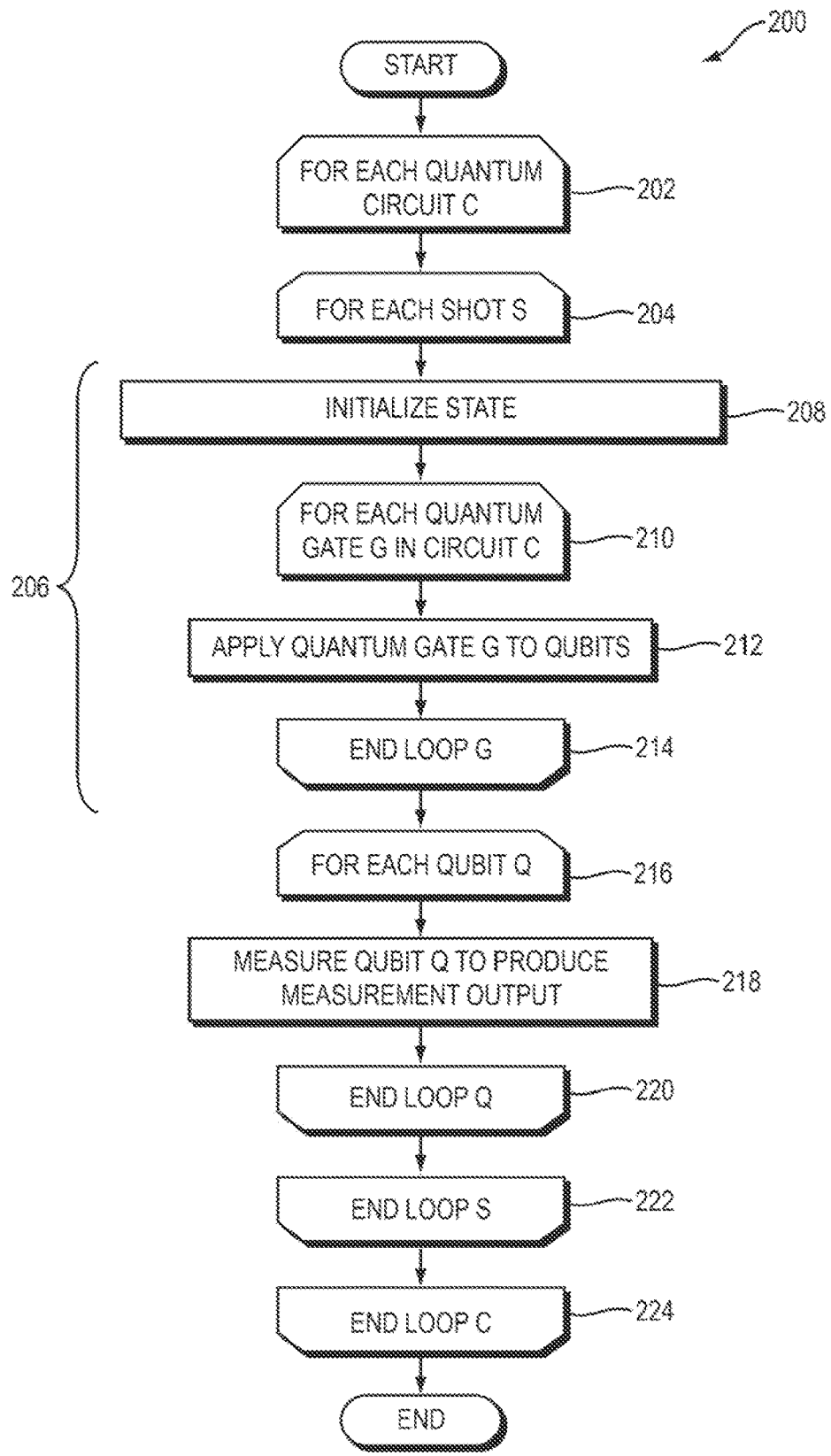
FIG. 2A is a flowchart of a method performed by the quantum computer of FIG. 1 according to one embodiment of the present invention.
Figure 2B:
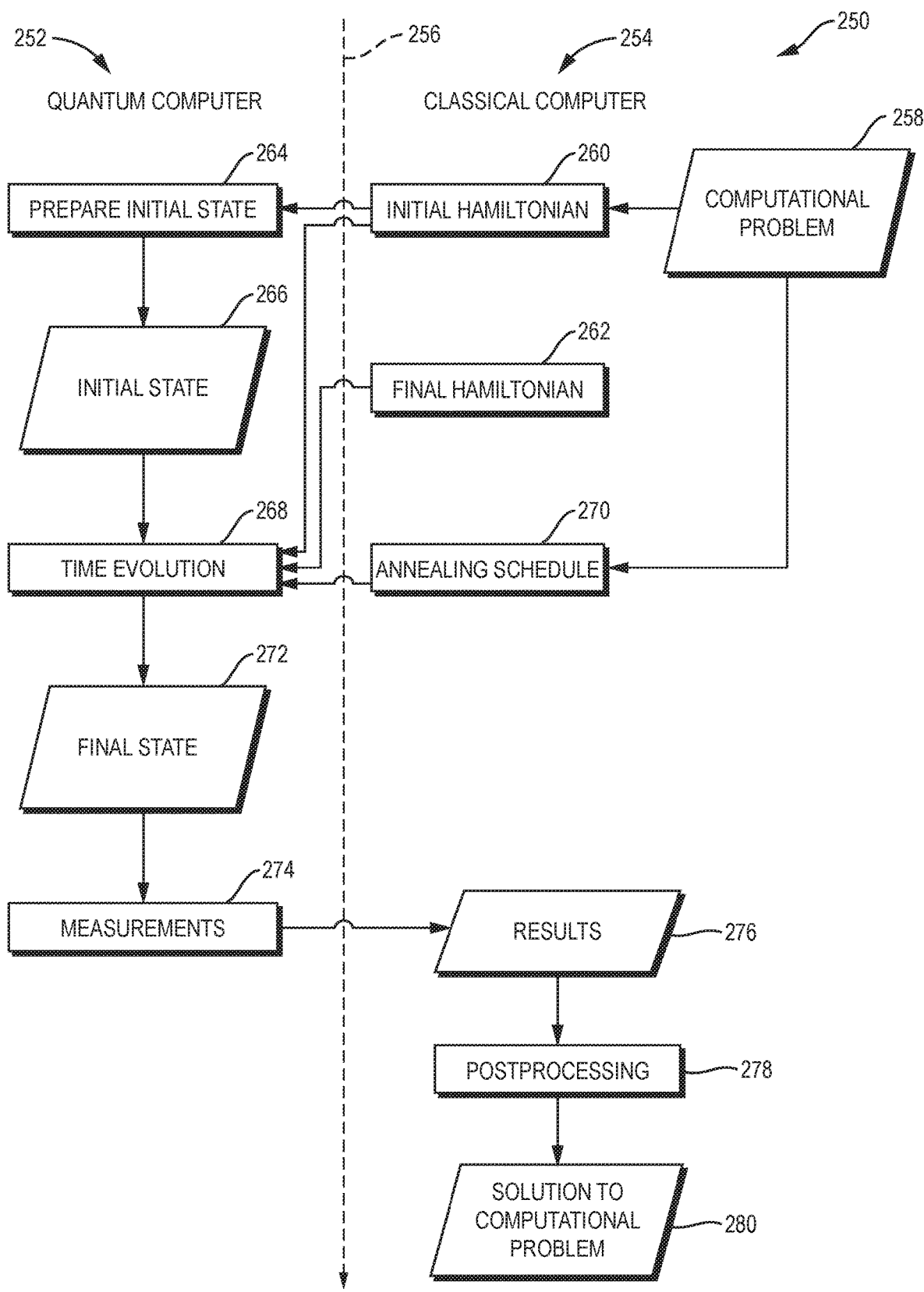
FIG. 2B is a diagram of a hybrid quantum-classical computer which performs quantum annealing according to one embodiment of the present invention.

FIG. 2B shows a diagram illustrating operations typically performed by a computer system 250 which implements quantum annealing. The system 250 includes both a quantum computer 252 and a classical computer 254. Operations shown on the left of the dashed vertical line 256 typically are performed by the quantum computer 252, while operations shown on the right of the dashed vertical line 256 typically are performed by the classical computer 254.

Quantum annealing starts with the classical computer 254 generating an initial Hamiltonian 260 and a final Hamiltonian 262 based on a computational problem 258 to be solved, and providing the initial Hamiltonian 260, the final Hamiltonian 262 and an annealing schedule 270 as input to the quantum computer 252. The quantum computer 252 prepares a well-known initial state 266 (FIG. 2B, operation 264), such as a quantum-mechanical superposition of all possible states (candidate states) with equal weights, based on the initial Hamiltonian 260. The classical computer 254 provides the initial Hamiltonian 260, a final Hamiltonian 262, and an annealing schedule 270 to the quantum computer 252. The quantum computer 252 starts in the initial state 266, and evolves its state according to the annealing schedule 270 following the time-dependent Schrödinger equation, a natural quantum-mechanical evolution of physical systems (FIG. 2B, operation 268). More specifically, the state of the quantum computer 252 undergoes time evolution under a time-dependent Hamiltonian, which starts from the initial Hamiltonian 260 and terminates at the final Hamiltonian 262. If the rate of change of the system Hamiltonian is slow enough, the system stays close to the ground state of the instantaneous Hamiltonian. If the rate of change of the system Hamiltonian is accelerated, the system may leave the ground state temporarily but produce a higher likelihood of concluding in the ground state of the final problem Hamiltonian, i.e., diabatic quantum computation. At the end of the time evolution, the set of qubits on the quantum annealer is in a final state 272, which is expected to be close to the ground state of the classical Ising model that corresponds to the solution to the original optimization problem. An experimental demonstration of the success of quantum annealing for random magnets was reported immediately after the initial theoretical proposal.

The final state 272 of the quantum computer 252 is measured, thereby producing results 276 (i.e., measurements) (FIG. 2B, operation 274). The measurement operation 274 may be performed, for example, in any of the ways disclosed herein, such as in any of the ways disclosed herein in connection with the measurement unit 110 in FIG. 1. The classical computer 254 performs postprocessing on the measurement results 276 to produce output 280 representing a solution to the original computational problem 258 (FIG. 2B, operation 278).

As yet another alternative example, embodiments of the present invention may be implemented, in whole or in part, using a quantum computer that is implemented using a one-way quantum computing architecture, also referred to as a measurement-based quantum computing architecture, which is another alternative to the gate model quantum computing architecture. More specifically, the one-way or measurement based quantum computer (MBQC) is a method of quantum computing that first prepares an entangled resource state, usually a cluster state or graph state, then performs single qubit measurements on it. It is "one-way" because the resource state is destroyed by the measurements.

The outcome of each individual measurement is random, but they are related in such a way that the computation always succeeds. In general the choices of basis for later measurements need to depend on the results of earlier measurements, and hence the measurements cannot all be performed at the same time.

Any of the functions disclosed herein may be implemented using means for performing those functions. Such means include, but are not limited to, any of the components disclosed herein, such as the computer-related components described below.

Referring to FIG. 1, a diagram is shown of a system 100 implemented according to one embodiment of the present invention. Referring to FIG. 2A, a flowchart is shown of a method 200 performed by the system 100 of FIG. 1 according to one embodiment of the present invention. The system 100 includes a quantum computer 102. The quantum computer 102 includes a plurality of qubits 104, which may be implemented in any of the ways disclosed herein. There may be any number of qubits 104 in the quantum computer 102. For example, the qubits 104 may include or consist of no more than 2 qubits, no more than 4 qubits, no more than 8 qubits, no more than 16 qubits, no more than 32 qubits, no more than 64 qubits, no more than 128 qubits, no more than 256 qubits, no more than 512 qubits, no more than 1024 qubits, no more than 2048 qubits, no more than 4096 qubits, or no more than 8192 qubits. These are merely examples, in practice there may be any number of qubits 104 in the quantum computer 102.

There may be any number of gates in a quantum circuit. However, in some embodiments the number of gates may be at least proportional to the number of qubits 104 in the quantum computer 102. In some embodiments the gate depth may be no greater than the number of qubits 104 in the quantum computer 102, or no greater than some linear multiple of the number of qubits 104 in the quantum computer 102 (e.g., 2, 3, 4, 5, 6, or 7).

The qubits 104 may be interconnected in any graph pattern. For example, they be connected in a linear chain, a two-dimensional grid, an all-to-all connection, any combination thereof, or any subgraph of any of the preceding.

As will become clear from the description below, although element 102 is referred to herein as a "quantum computer," this does not imply that all components of the quantum computer 102 leverage quantum phenomena. One or more components of the quantum computer 102 may, for example, be classical (i.e., non-quantum components) components which do not leverage quantum phenomena.

The quantum computer 102 includes a control unit 106, which may include any of a variety of circuitry and/or other machinery for performing the functions disclosed herein. The control unit 106 may, for example, consist entirely of classical components. The control unit 106 generates and provides as output one or more control signals 108 to the qubits 104. The control signals 108 may take any of a variety of forms, such as any kind of electromagnetic signals, such as electrical signals, magnetic signals, optical signals (e.g., laser pulses), or any combination thereof.

For example:
In embodiments in which some or all of the qubits 104 are implemented as photons (also referred to as a "quantum optical" implementation) that travel along waveguides, the control unit 106 may be a beam splitter (e.g., a heater or a mirror), the control signals 108 may be signals that control the heater or the rotation of the mirror, the measurement unit 110 may be a photodetector, and the measurement signals 112 may be photons.

In embodiments in which some or all of the qubits 104 are implemented as charge type qubits (e.g., transmon, X-mon, G-mon) or flux-type qubits (e.g., flux qubits, capacitively shunted flux qubits) (also referred to as a "circuit quantum electrodynamic" (circuit QED) implementation), the control unit 106 may be a bus resonator activated by a drive, the control signals 108 may be cavity modes, the measurement unit 110 may be a second resonator (e.g., a low-Q resonator), and the measurement signals 112 may be voltages measured from the second resonator using dispersive readout techniques.

In embodiments in which some or all of the qubits 104 are implemented as superconducting circuits, the control unit 106 may be a circuit QED-assisted control unit or a direct capacitive coupling control unit or an inductive capacitive coupling control unit, the control signals 108 may be cavity modes, the measurement unit 110 may be a second resonator (e.g., a low-Q resonator), and the measurement signals 112 may be voltages measured from the second resonator using dispersive readout techniques.

In embodiments in which some or all of the qubits 104 are implemented as trapped ions (e.g., electronic states of, e.g., magnesium ions), the control unit 106 may be a laser, the control signals 108 may be laser pulses, the measurement unit 110 may be a laser and either a CCD or a photodetector (e.g., a photomultiplier tube), and the measurement signals 112 may be photons.

In embodiments in which some or all of the qubits 104 are implemented using nuclear magnetic resonance (NMR) (in which case the qubits may be molecules, e.g., in liquid or solid form), the control unit 106 may be a radio frequency (RF) antenna, the control signals 108 may be RF fields emitted by the RF antenna, the measurement unit 110 may be another RF antenna, and the measurement signals 112 may be RF fields measured by the second RF antenna.

In embodiments in which some or all of the qubits 104 are implemented as nitrogen-vacancy centers (NV centers), the control unit 106 may, for example, be a laser, a microwave antenna, or a coil, the control signals 108 may be visible light, a microwave signal, or a constant electromagnetic field, the measurement unit 110 may be a photodetector, and the measurement signals 112 may be photons.

In embodiments in which some or all of the qubits 104 are implemented as two-dimensional quasiparticles called "anyons" (also referred to as a "topological quantum computer" implementation), the control unit 106 may be nanowires, the control signals 108 may be local electrical fields or microwave pulses, the measurement unit 110 may be superconducting circuits, and the measurement signals 112 may be voltages.

In embodiments in which some or all of the qubits 104 are implemented as semiconducting material (e.g., nanowires), the control unit 106 may be microfabricated gates, the control signals 108 may be RF or microwave signals, the measurement unit 110 may be microfabricated gates, and the measurement signals 112 may be RF or microwave signals.

Although not shown explicitly in FIG. 1 and not required, the measurement unit 110 may provide one or more feedback signals 114 to the control unit 106 based on the measurement signals 112. For example, quantum computers referred to as "one-way quantum computers" or "measurement-based quantum computers" utilize such feedback 114 from the measurement unit 110 to the control unit 106. Such feedback 114 is also necessary for the operation of fault-tolerant quantum computing and error correction.

The control signals 108 may, for example, include one or more state preparation signals which, when received by the qubits 104, cause some or all of the qubits 104 to change their states. Such state preparation signals constitute a quantum circuit also referred to as an "ansatz circuit." The resulting state of the qubits 104 is referred to herein as an "initial state" or an "ansatz state." The process of outputting the state preparation signal(s) to cause the qubits 104 to be in their initial state is referred to herein as "state preparation" (FIG. 2A, section 206). A special case of state preparation is "initialization," also referred to as a "reset operation," in which the initial state is one in which some or all of the qubits 104 are in the "zero" state i.e. the default single-qubit state. More generally, state preparation may involve using the state preparation signals to cause some or all of the qubits 104 to be in any distribution of desired states. In some embodiments, the control unit 106 may first perform initialization on the qubits 104 and then perform preparation on the qubits 104, by first outputting a first set of state preparation signals to initialize the qubits 104, and by then outputting a second set of state preparation signals to put the qubits 104 partially or entirely into non-zero states.

Another example of control signals 108 that may be output by the control unit 106 and received by the qubits 104 are gate control signals. The control unit 106 may output such gate control signals, thereby applying one or more gates to the qubits 104. Applying a gate to one or more qubits causes the set of qubits to undergo a physical state change which embodies a corresponding logical gate operation (e.g., single-qubit rotation, two-qubit entangling gate or multi-qubit operation) specified by the received gate control signal. As this implies, in response to receiving the gate control signals, the qubits 104 undergo physical transformations which cause the qubits 104 to change state in such a way that the states of the qubits 104, when measured (see below), represent the results of performing logical gate operations specified by the gate control signals. The term "quantum gate," as used herein, refers to the application of a gate control signal to one or more qubits to cause those qubits to undergo the physical transformations described above and thereby to implement a logical gate operation.

It should be understood that the dividing line between state preparation (and the corresponding state preparation signals) and the application of gates (and the corresponding gate control signals) may be chosen arbitrarily. For example, some or all of the components and operations that are illustrated in FIGS. 1 and 2A-2B as elements of "state preparation" may instead be characterized as elements of gate application. Conversely, for example, some or all of the components and operations that are illustrated in FIGS. 1 and 2A-2B as elements of "gate application" may instead be characterized as elements of state preparation. As one particular example, the system and method of FIGS. 1 and 2A-2B may be characterized as solely performing state preparation followed by measurement, without any gate application, where the elements that are described herein as being part of gate application are instead considered to be part of state preparation. Conversely, for example, the system and method of FIGS. 1 and 2A-2B may be characterized as solely performing gate application followed by measurement, without any state preparation, and where the elements that are described herein as being part of state preparation are instead considered to be part of gate application.

The quantum computer 102 also includes a measurement unit 110, which performs one or more measurement operations on the qubits 104 to read out measurement signals 112 (also referred to herein as "measurement results") from the qubits 104, where the measurement results 112 are signals representing the states of some or all of the qubits 104. In practice, the control unit 106 and the measurement unit 110 may be entirely distinct from each other, or contain some components in common with each other, or be implemented using a single unit (i.e., a single unit may implement both the control unit 106 and the measurement unit 110). For example, a laser unit may be used both to generate the control signals 108 and to provide stimulus (e.g., one or more laser beams) to the qubits 104 to cause the measurement signals 112 to be generated.

In general, the quantum computer 102 may perform various operations described above any number of times. For example, the control unit 106 may generate one or more control signals 108, thereby causing the qubits 104 to perform one or more quantum gate operations. The measurement unit 110 may then perform one or more measurement operations on the qubits 104 to read out a set of one or more measurement signals 112. The measurement unit 110 may repeat such measurement operations on the qubits 104 before the control unit 106 generates additional control signals 108, thereby causing the measurement unit 110 to read out additional measurement signals 112 resulting from the same gate operations that were performed before reading out the previous measurement signals 112. The measurement unit 110 may repeat this process any number of times to generate any number of measurement signals 112 corresponding to the same gate operations. The quantum computer 102 may then aggregate such multiple measurements of the same gate operations in any of a variety of ways.

After the measurement unit 110 has performed one or more measurement operations on the qubits 104 after they have performed one set of gate operations, the control unit 106 may generate one or more additional control signals 108, which may differ from the previous control signals 108, thereby causing the qubits 104 to perform one or more additional quantum gate operations, which may differ from the previous set of quantum gate operations. The process described above may then be repeated, with the measurement unit 110 performing one or more measurement operations on the qubits 104 in their new states (resulting from the most recently-performed gate operations).

In general, the system 100 may implement a plurality of quantum circuits as follows. For each quantum circuit C in the plurality of quantum circuits (FIG. 2A, operation 202), the system 100 performs a plurality of "shots" on the qubits 104. The meaning of a shot will become clear from the description that follows. For each shot S in the plurality of shots (FIG. 2A, operation 204), the system 100 prepares the state of the qubits 104 (FIG. 2A, section 206). More specifically, for each quantum gate G in quantum circuit C (FIG. 2A, operation 210), the system 100 applies quantum gate G to the qubits 104 (FIG. 2A, operations 212 and 214).

Then, for each of the qubits Q 104 (FIG. 2A, operation 216), the system 100 measures the qubit Q to produce measurement output representing a current state of qubit Q (FIG. 2A, operations 218 and 220).

The operations described above are repeated for each shot S (FIG. 2A, operation 222), and circuit C (FIG. 2A, operation 224). As the description above implies, a single "shot" involves preparing the state of the qubits 104 and applying all of the quantum gates in a circuit to the qubits 104 and then measuring the states of the qubits 104; and the system 100 may perform multiple shots for one or more circuits.

Figure 3:
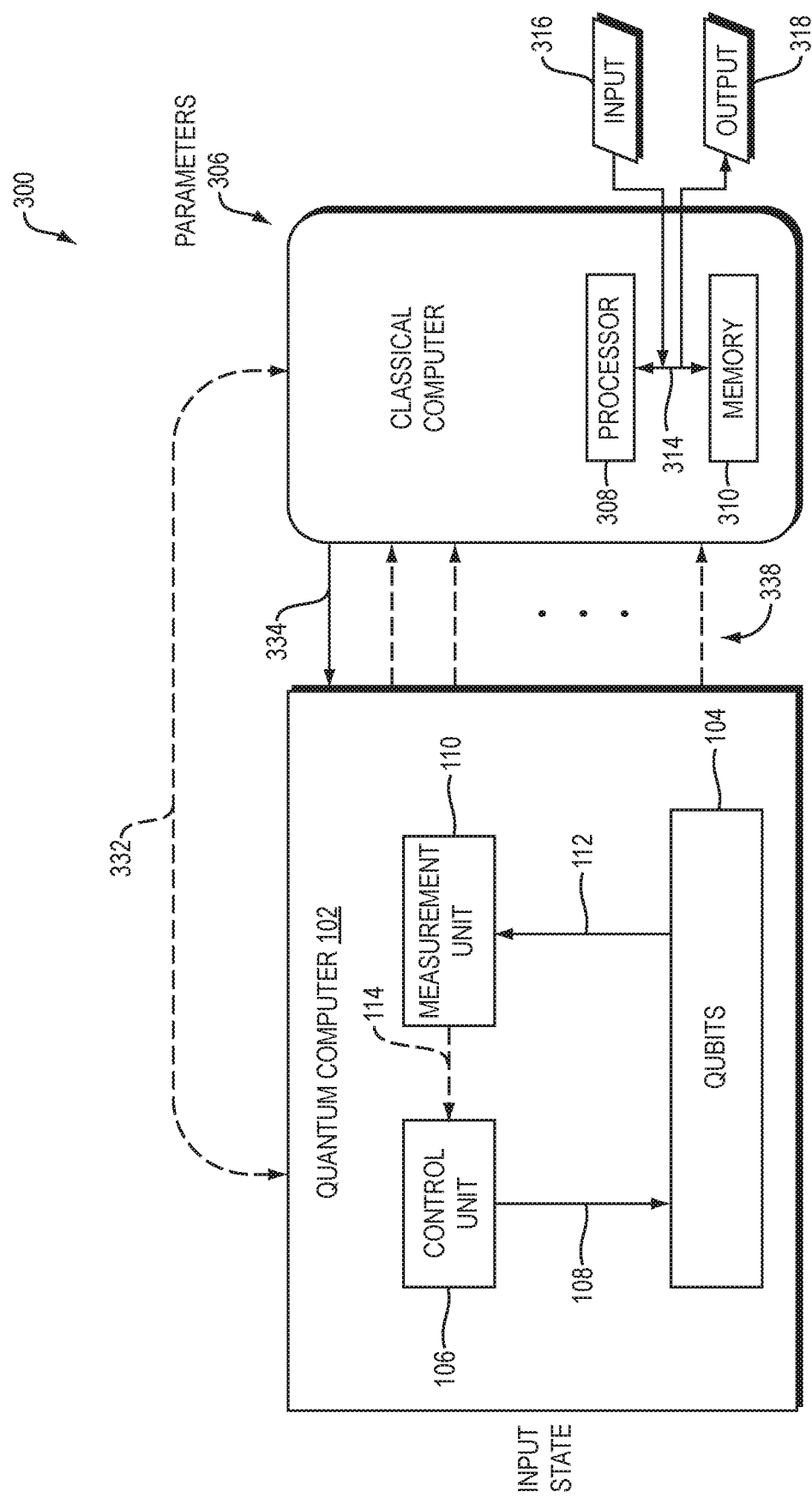
FIG. 3 is a diagram of a hybrid quantum-classical computer according to one embodiment of the present invention.

Referring to FIG. 3, a diagram is shown of a hybrid quantum classical (HQC) computer 300 implemented according to one embodiment of the present invention. The HQC 300 includes a quantum computer component 102 (which may, for example, be implemented in the manner shown and described in connection with FIG. 1) and a classical computer component 306. The classical computer component may be a machine implemented according to the general computing model established by John Von Neumann, in which programs are written in the form of ordered lists of instructions and stored within a classical (e.g., digital) memory 310 and executed by a classical (e.g., digital) processor 308 of the classical computer. The memory 310 is classical in the sense that it stores data in a storage medium in the form of bits, which have a single definite binary state at any point in time. The bits stored in the memory 310 may, for example, represent a computer program. The classical computer component 304 typically includes a bus 314. The processor 308 may read bits from and write bits to the memory 310 over the bus 314. For example, the processor 308 may read instructions from the computer program in the memory 310, and may optionally receive input data 316 from a source external to the computer 302, such as from a user input device such as a mouse, keyboard, or any other input device. The processor 308 may use instructions that have been read from the memory 310 to perform computations on data read from the memory 310 and/or the input 316, and generate output from those instructions. The processor 308 may store that output back into the memory 310 and/or provide the output externally as output data 318 via an output device, such as a monitor, speaker, or network device.

The quantum computer component 102 may include a plurality of qubits 104, as described above in connection with FIG. 1. A single qubit may represent a one, a zero, or any quantum superposition of those two qubit states. The classical computer component 304 may provide classical state preparation signals Y32 to the quantum computer 102, in response to which the quantum computer 102 may prepare the states of the qubits 104 in any of the ways disclosed herein, such as in any of the ways disclosed in connection with FIGS. 1 and 2A-2B.

Once the qubits 104 have been prepared, the classical processor 308 may provide classical control signals Y34 to the quantum computer 102, in response to which the quantum computer 102 may apply the gate operations specified by the control signals Y32 to the qubits 104, as a result of which the qubits 104 arrive at a final state. The measurement unit 110 in the quantum computer 102 (which may be implemented as described above in connection with FIGS. 1 and 2A-2B) may measure the states of the qubits 104 and produce measurement output Y38 representing the collapse of the states of the qubits 104 into one of their eigenstates. As a result, the measurement output Y38 includes or consists of bits and therefore represents a classical state. The quantum computer 102 provides the measurement output Y38 to the classical processor 308. The classical processor 308 may store data representing the measurement output Y38 and/or data derived therefrom in the classical memory 310.

The steps described above may be repeated any number of times, with what is described above as the final state of the qubits 104 serving as the initial state of the next iteration. In this way, the classical computer 304 and the quantum computer 102 may cooperate as co-processors to perform joint computations as a single computer system.

Although certain functions may be described herein as being performed by a classical computer and other functions may be described herein as being performed by a quantum computer, these are merely examples and do not constitute limitations of the present invention. A subset of the functions which are disclosed herein as being performed by a quantum computer may instead be performed by a classical computer. For example, a classical computer may execute functionality for emulating a quantum computer and provide a subset of the functionality described herein, albeit with functionality limited by the exponential scaling of the simulation. Functions which are disclosed herein as being performed by a classical computer may instead be performed by a quantum computer.

The techniques described above may be implemented, for example, in hardware, in one or more computer programs tangibly stored on one or more computer-readable media, firmware, or any combination thereof, such as solely on a quantum computer, solely on a classical computer, or on a hybrid quantum classical (HQC) computer. The techniques disclosed herein may, for example, be implemented solely on a classical computer, in which the classical computer emulates the quantum computer functions disclosed herein.

The techniques described above may be implemented in one or more computer programs executing on (or executable by) a programmable computer (such as a classical computer, a quantum computer, or an HQC) including any combination of any number of the following: a processor, a storage medium readable and/or writable by the processor (including, for example, volatile and non-volatile memory and/or storage elements), an input device, and an output device. Program code may be applied to input entered using the input device to perform the functions described and to generate output using the output device.

Embodiments of the present invention include features which are only possible and/or feasible to implement with the use of one or more computers, computer processors, and/or other elements of a computer system. Such features are either impossible or impractical to implement mentally and/or manually, especially when applied to problem instances having large numbers of qubits (e.g., greater than 10, 50, 100, 500, or 1000 qubits). For example, embodiments of the present invention define a variational quantum channel circuit on a quantum computer for use in developing probability distributions of error syndromes. In addition, the embodiments of the present invention allows for error recovery on near term quantum devices. Such an algorithm cannot be performed mentally or manually and therefore is inherently rooted in computer technology generally and in quantum computer technology specifically.

Any claims herein which affirmatively require a computer, a processor, a memory, or similar computer-related elements, are intended to require such elements, and should not be interpreted as if such elements are not present in or required by such claims. Such claims are not intended, and should not be interpreted, to cover methods and/or systems which lack the recited computer-related elements. For example, any method claim herein which recites that the claimed method is performed by a computer, a processor, a memory, and/or similar computer-related element, is intended to, and should only be interpreted to, encompass methods which are performed by the recited computer-related element(s). Such a method claim should not be interpreted, for example, to encompass a method that is performed mentally or by hand (e.g., using pencil and paper). Similarly, any product claim herein which recites that the claimed product includes a computer, a processor, a memory, and/or similar computer-related element, is intended to, and should only be interpreted to, encompass products which include the recited computer-related element(s). Such a product claim should not be interpreted, for example, to encompass a product that does not include the recited computer-related element(s).

In embodiments in which a classical computing component executes a computer program providing any subset of the functionality within the scope of the claims below, the computer program may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor, which may be either a classical processor or a quantum processor. Method steps of the invention may be performed by one or more computer processors executing a program tangibly embodied on a computer-readable medium to perform functions of the invention by operating on input and generating output. Suitable processors include, by way of example, both general and special purpose microprocessors. Generally, the processor receives (reads) instructions and data from a memory (such as a read-only memory and/or a random access memory) and writes (stores) instructions and data to the memory. Storage devices suitable for tangibly embodying computer program instructions and data include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits) or FPGAs (Field-Programmable Gate Arrays). A classical computer can generally also receive (read) programs and data from, and write (store) programs and data to, a non-transitory computer-readable storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

Any data disclosed herein may be implemented, for example, in one or more data structures tangibly stored on a non-transitory computer-readable medium (such as a classical computer-readable medium, a quantum computer-readable medium, or an HQC computer-readable medium). Embodiments of the invention may store such data in such data structure(s) and read such data from such data structure(s).

What is claimed is:

1. A method for use with a hybrid quantum-classical device, the hybrid quantum-classical device comprising a quantum device and a classical computer, the classical computer comprising at least one processor and at least one non-transitory computer-readable medium having computer program instructions stored thereon, the computer program instructions being executable by the at least one processor to perform the method, the method comprising:
    (A) initializing the quantum device with at least one initial state;
    (B) applying a quantum error correcting (QEC) code to the quantum device in the at least one initial state to produce a first output distribution;
    (C) sampling the first output distribution;
    (D) simulating, on a classical computer, the first output distribution of the quantum device, the simulating comprising:
        (D) (1) initializing a simulation of the quantum device on the classical computer with the at least one initial state;
        (D) (2) applying the QEC code to the simulation of the quantum device;
        (D) (3) applying a simulated variational quantum channel to the simulation of the quantum device to produce a second output distribution;
    (E) adjusting parameters of the simulated variational quantum channel to increase the similarity of the first and second output distributions.

2. The method of claim 1, wherein (E) comprises adjusting parameters of the simulated variational quantum channel to optimally match the first output distribution.

3. The method of claim 1, wherein the simulated quantum device comprises a simulated programmable quantum computer.

4. The method of claim 1, wherein the simulated quantum device comprises a simulated quantum annealer.

5. The method of claim 1, wherein the simulated quantum device comprises a simulated photonic quantum computer, and wherein the QEC comprises a quantum repeater.

6. The method of claim 1, wherein the quantum device comprises a quantum computer, the quantum computer comprising a plurality of qubits.

7. The method of claim 6, further comprising using the simulated variational quantum channel to determine improvements to fidelities of two-qubit gates in the quantum computer.

8. The method of claim 1, wherein the at least one initial state comprises a plurality of initial states.

9. The method of claim 1, further comprising:
    (F) before (B), selecting the QEC code based on error modes of the quantum device.

10. The method of claim 1, further comprising:
    (F) selecting the QEC code based on error modes of the quantum device.

11. A system comprising at least one non-transitory computer-readable medium having computer program instructions stored thereon, the computer program instructions being executable by at least one processor to perform a method, the method comprising:
    (A) initializing a quantum device with at least one initial state;
    (B) applying a quantum error correcting (QEC) code to the quantum device in the at least one initial state to produce a first output distribution;
    (C) sampling the first output distribution;
    (D) simulating, on a classical computer, the first output distribution of the quantum device, the simulating comprising:
        (D) (1) initializing a simulation of the quantum device on the classical computer with the at least one initial state;
        (D) (2) applying the QEC code to the simulation of the quantum device;
        (D) (3) applying a simulated variational quantum channel to the simulation of the quantum device to produce a second output distribution;
    (E) adjusting parameters of the simulated variational quantum channel to increase the similarity of the first and second output distributions.

12. The system of claim 11, wherein (E) comprises adjusting parameters of the simulated variational quantum channel to optimally match the first output distribution.

13. The system of claim 11, wherein the simulated quantum device comprises a simulated programmable quantum computer.

14. The system of claim 11, wherein the simulated quantum device comprises a simulated quantum annealer.

15. The system of claim 11, wherein the simulated quantum device comprises a simulated photonic quantum computer, and wherein the QEC comprises a quantum repeater.

16. The system of claim 11, wherein the quantum device comprises a quantum computer, the quantum computer comprising a plurality of qubits.

17. The system of claim 16, further comprising using the simulated variational quantum channel to determine improvements to fidelities of two-qubit gates in the quantum computer.

18. The system of claim 11, wherein the at least one initial state comprises a plurality of initial states.

19. The system of claim 11, wherein the method further comprises:
    (F) before (B), selecting the QEC code based on error modes of the quantum device.

20. The system of claim 11, wherein the method further comprises:
 (F) selecting the QEC code based on error modes of the quantum device.

\* \* \* \* \*